(12) United States Patent
Gupta et al.

(10) Patent No.: US 8,753,990 B2
(45) Date of Patent: Jun. 17, 2014

(54) SYSTEMS AND METHODS OF LASER TEXTURING AND CRYSTALLIZATION OF MATERIAL SURFACES

(75) Inventors: Mool C. Gupta, Yorktown, VA (US); Barada K. Nayak, Charlottesville, VA (US)

(73) Assignee: University of Virginia Patent Foundation, Charlottesville, VA (US)

( * ) Notice: Subject to any disclaimer, the term of this patent is extended or adjusted under 35 U.S.C. 154(b) by 1045 days.

(21) Appl. No.: 12/158,553

(22) PCT Filed: Dec. 21, 2006

(86) PCT No.: PCT/US2006/049065
§ 371 (c)(1),
(2), (4) Date: Jun. 20, 2008

(87) PCT Pub. No.: WO2008/091242
PCT Pub. Date: Jul. 31, 2008

(65) Prior Publication Data
US 2010/0219506 A1  Sep. 2, 2010

Related U.S. Application Data

(60) Provisional application No. 60/752,545, filed on Dec. 21, 2005, provisional application No. 60/843,874, filed on Sep. 12, 2006, provisional application No. 60/860,735, filed on Nov. 22, 2006.

(51) Int. Cl.
*B82Y 30/00* (2011.01)
*B82Y 40/00* (2011.01)

(52) U.S. Cl.
USPC ............. 438/795; 438/308; 438/487; 216/65; 977/901

(58) Field of Classification Search
USPC ............. 216/58–81; 977/839–901, 963; 438/308, 487, 795–799, 940
See application file for complete search history.

(56) References Cited

U.S. PATENT DOCUMENTS 4,622,095 A   11/1986  Grobman
4,972,061 A * 11/1990  Duley et al. .............. 219/121.66
(Continued)

FOREIGN PATENT DOCUMENTS

WO   WO 2005/072437   8/2005

OTHER PUBLICATIONS

"Solidification driven extrusion of spikes during laser melting of silicon pillars" by David Mills and Kurt Kolasinski, Nanotechnology 17 (2006) 2741-2744, May 16, 2006.*

(Continued)

*Primary Examiner* — Mark Tornow
*Assistant Examiner* — Eric Ward
(74) *Attorney, Agent, or Firm* — Robert J. Decker

(57) ABSTRACT

The surface of a material is textured and crystallized in a single step by exposing the surface to pulses from an ultrafast laser. The laser treatment causes pillars to form on the treated surface. These pillars provide for greater light absorption. The crystallization of the material provides for higher electric conductivity and changes in optical properties of the material. The method may be performed in a gaseous environment, so that laser assisted chemical etching will aid in the texturing of the surface. This method may be used on various material surfaces, such as semiconductors, metals, ceramics, polymers, and glasses.

71 Claims, 17 Drawing Sheets

(56) References Cited

U.S. PATENT DOCUMENTS

| | | | |
|---|---|---|---|
| 5,473,138 A * | 12/1995 | Singh et al. | 219/121.69 |
| 5,500,071 A * | 3/1996 | Kaltenbach et al. | 156/272.8 |
| 5,624,529 A | 4/1997 | Shul | |
| 5,818,700 A | 10/1998 | Purinton | |
| 6,169,014 B1 | 1/2001 | McCulloch | |
| 6,238,847 B1 | 5/2001 | Axtell, III | |
| 6,451,631 B1 | 9/2002 | Grigoropoluos | |
| 6,489,188 B2 | 12/2002 | Jung | |
| 6,504,180 B1 | 1/2003 | Heremans | |
| 6,613,161 B2 | 9/2003 | Zheng | |
| 6,635,932 B2 | 10/2003 | Grigoropoluos | |
| 6,746,942 B2 | 6/2004 | Sato | |
| 6,864,190 B2 | 3/2005 | Han | |
| 6,893,886 B2 * | 5/2005 | Liu et al. | 438/20 |
| 6,919,162 B1 * | 7/2005 | Brennen et al. | 430/272.1 |
| 6,921,722 B2 | 7/2005 | Ogure | |
| 6,948,843 B2 | 9/2005 | Laugharn | |
| 7,057,256 B2 | 6/2006 | Carey | |
| 7,354,792 B2 | 4/2008 | Carey | |
| 7,390,689 B2 | 6/2008 | Mazur | |
| 7,442,629 B2 | 10/2008 | Mazur | |
| 7,469,831 B2 | 12/2008 | Gu | |
| 7,675,952 B2 | 3/2010 | Ushinsky | |
| 7,750,353 B2 | 7/2010 | Lee | |
| 7,754,508 B2 | 7/2010 | Lee | |
| 7,884,446 B2 | 2/2011 | Mazur | |
| 8,143,686 B2 * | 3/2012 | Mazur et al. | 257/442 |
| 8,354,286 B2 | 1/2013 | Lee | |
| 8,598,051 B2 | 12/2013 | Mazur | |
| 2001/0030002 A1 * | 10/2001 | Zheng et al. | 148/241 |
| 2003/0029495 A1 | 2/2003 | Mazur | |
| 2004/0000540 A1 * | 1/2004 | Soboyejo et al. | 219/121.69 |
| 2004/0076813 A1 * | 4/2004 | Han et al. | 428/312.6 |
| 2004/0227140 A1 | 11/2004 | Lee | |
| 2005/0170567 A1 | 8/2005 | Tanaka | |
| 2006/0000814 A1 * | 1/2006 | Gu et al. | 219/121.69 |
| 2006/0079062 A1 * | 4/2006 | Mazur et al. | 438/308 |
| 2008/0044943 A1 * | 2/2008 | Mazur et al. | 438/95 |
| 2010/0002740 A1 | 1/2010 | Ushinsky | |
| 2011/0033661 A1 | 2/2011 | Oawa | |

OTHER PUBLICATIONS

"Microstructuring of silicon with femtosecond laser pulses" by Tsing-Hua Her et al., Applied Physics Letters vol. 73, No. 12 Sep. 21, 1998.*

"Comparison of structure and properties of femtosecond and nanosecond laserstructured silicon" by C. H. Crouch et al., Applied Physics Letters vol. 84, No. 11 Mar. 15, 2004.*

Nayak, et al., "Formation of nano-textured conical microstructures in titanium metal surface by femtosecond laser irradiation", Appl. Phys. A 90, 399-402 (2008).

Nayak, et al., "Ultrafast-laser-assisted chemical restructuring of silicon and germanium surfaces", Appl. Surf. Sci. (2007), doi:10/1016/j.apsusc.2007.01.079.

Nayak, et al., "Spontaneous formation of nanospiked microstructures in germanium by femtosecond laser irradiation", Nanotechnology 18 (2007) 195302 (4pp).

Nayak, et al., "Femtosecond Laser-Induced Micro-Structure of Thin a-Si:H Films", MRS Fall 2004 meeting, Nov. 29-Dec. 3, 2004, Boston, MA.

Nayak, et al., "Femtosecond Laser-Induced Micro-Structure of Thin a-Si:H Films", Mater. Res. Soc. Symp. Proc. 850, Warrendale, PA 2005.

Carey, et al., "Visible and near-infrared responsitivity of femtosecond-laser microstructured silicon photodiodes", Optics Letters, vol. 30, No. 14, Jul. 15, 2005, pp. 1773-1775.

Seia Year in Solar 2006, pp. 1-8.

Photovoltaics, Sun & Wind Energy, Sep. 2005, pp. 1-5.

Makower, et al., "Clean Energy Trends 2005", Clean Edge, Mar. 2005, pp. 1-18.

Kovalchenko, et al., "The Effect of Laser Texturing of Steel Surfaces and Speed-Load Parameters on the Transition of Lubrication Regime from Boundary to Hydrodynamic", Tribology Transactions 47:299-307, 2004.

Pedraza, et al., "Silicon Microcolumn Arrays grown by nanosecond pulsed-excimer laser irradiation", Applied Physics Letters, 1999, pp. 2322-2324, vol. 74, No. 16.

* cited by examiner

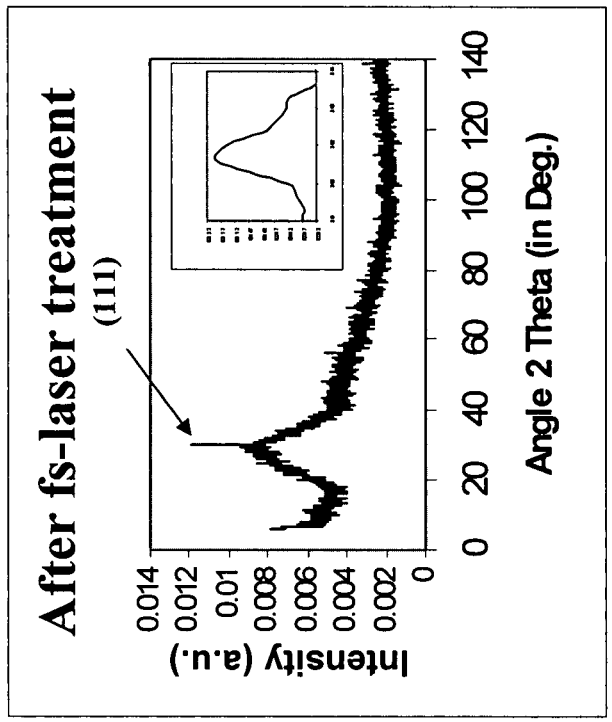
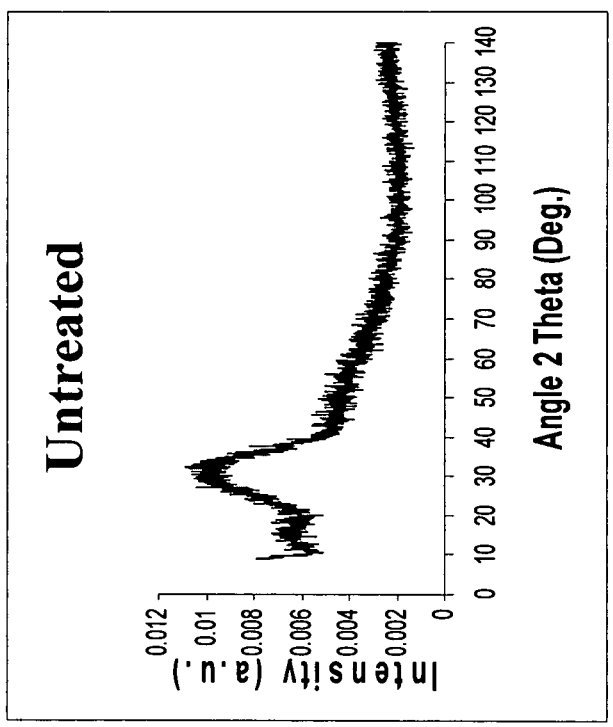
FIG. 6(a)
FIG. 6(b)

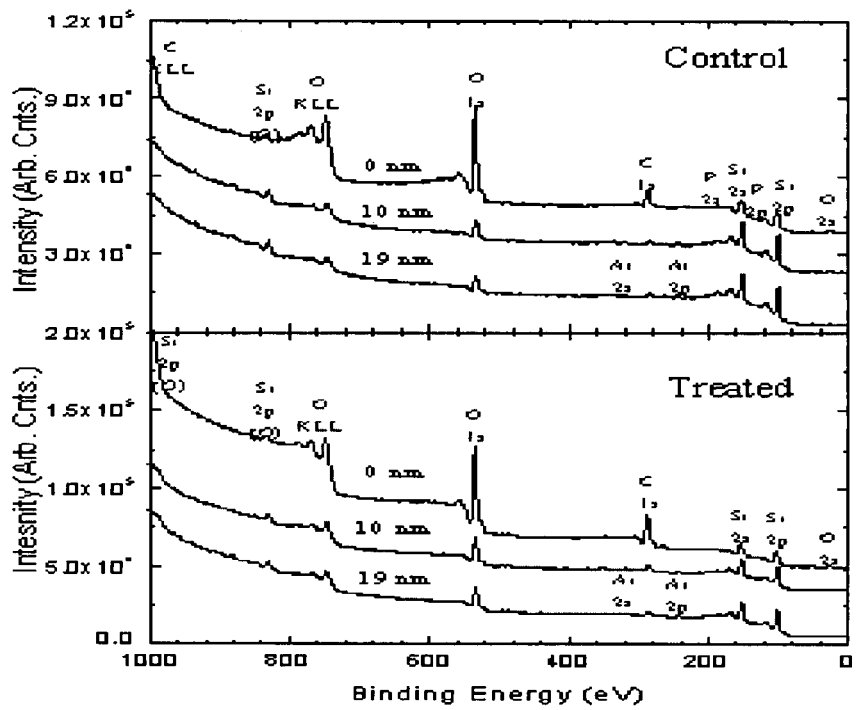
FIG. 10(a)
FIG. 10(b)
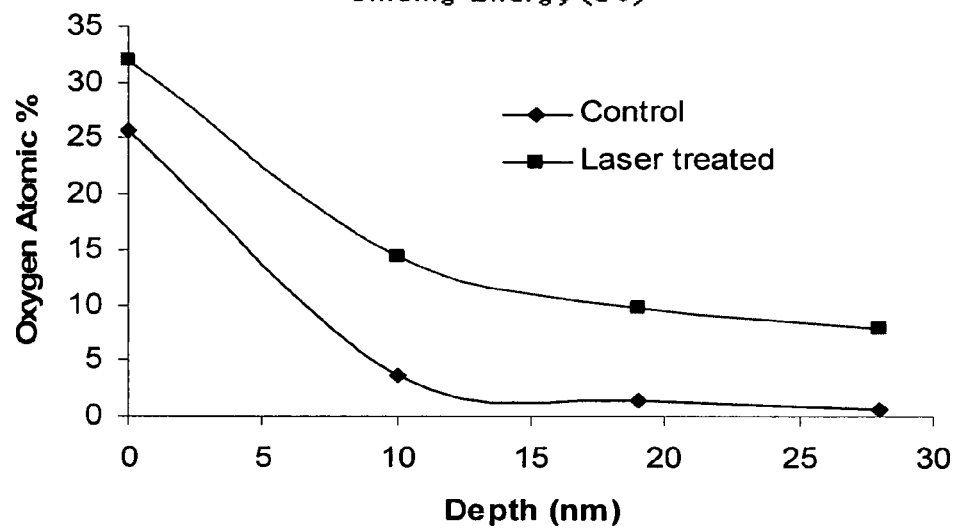
FIG. 10(c)

SYSTEMS AND METHODS OF LASER TEXTURING AND CRYSTALLIZATION OF MATERIAL SURFACES

STATEMENT OF GOVERNMENT INTEREST

The present invention was developed with United States Government support under National Science Foundation Grant Nos. EEC-0537883 and GA10507-31335 427250. The government has certain rights in the invention.

CROSS-REFERENCE TO RELATED APPLICATIONS

This application is a national stage filing of International Applications No. PCT/US2006/049065, filed on Dec. 21, 2006, which claims priority from U.S. Provisional Patent Application No. 60/752,545, filed on Dec. 21, 2005; U.S. Provisional Patent Application No. 60/843,874, filed on Sep. 12, 2006; and U.S. Provisional Patent Application No. 60/860,735, filed on Nov. 22, 2006. The full disclosures of these applications are incorporated herein by reference.

FIELD OF THE INVENTION

Apparatuses and methods consistent with the present invention relate to modifying surfaces, and more particularly, to modifying surfaces of thin films in order to alter their thermal, structural, optical, and electrical properties.

BACKGROUND OF THE INVENTION

Laser processing provides a unique method of modifying materials by depositing large amounts of energy onto the surface of a material in an extremely controlled manner. Laser processing enables the precisely localized treatment of a material. Laser processing is particularly useful after thin-film deposition of amorphous materials, which usually involves low temperature processing, and allows for the use of flexible and low melting temperature substrates for large area device fabrication. However, these devices lack better performance, usually due to poor electrical, optical, and/or structural properties. Laser processing of these devices with ultra-short laser pulses has been found to improve the properties of the devices, because the high peak intensities of the laser pulses rapidly texture the surface, and a subsequent quenching process induces crystallization in the material. The texturing of the surface leads to more light absorption in the material, and the subsequent crystallization improves the electronic properties of the material.

For example, thin film amorphous silicon (a-Si) based devices are inexpensive compared to their crystalline counterparts because of low temperature processing, which is suitable for deposition on large substrates, such as glass, plastic, and steel foils. However, solar cell devices fabricated using a-Si thin-films lack efficiency, have a high reflectivity across the electromagnetic spectrum, possess a larger band gap (~1.7 eV), and have limited carrier mobility. In order to improve the efficiency and sensitivity of a-Si based devices, post-deposition laser processing is usually recommended. This includes texturing and subsequent crystallization of the surface. Pulsed laser crystallization of thin a-Si films on various substrates has potential applications in the fabrication of thin film transistors for active matrix liquid crystal displays and efficient solar cells. Typically, nanosecond or microsecond lasers are utilized to crystallize such films through a rapid melting and solidification process. Methods of using a laser to crystallize a material surface are also disclosed by U.S. Pat. No. 6,169,014 to McCulloch, U.S. Pat. No. 6,451,631 to Grigoropoluos et al., U.S. Pat. No. 6,489,188 to Jung, and U.S. Pat. No. 6,635,932 to Grigoropoluos et al.

Methods of using an ultrafast laser to texture the surface of crystalline bulk silicon are disclosed in U.S. patent application Ser. No. 10/155,429 to Mazur. Mazur discloses a method of texturing the surface of a silicon substrate by irradiating the surface with ultra-short laser pulses in the presence of a background gas, such as $SF_6$. After texturing, the silicon surface in Mazur contains cone-like microstructures that are up to 50 μm high, and have widths of about 0.8 μm near the tip and up to 10 μm near the base. Also, Mills and Kolasinski disclose nanospikes formed atop silicon pillars when the sample is exposed to $SF_6$ gas diluted with helium (17 Nanotechnology 2471, 2006). Further, Vorobyev and Guo disclose the formation of nanoprotrusions with spherical tips on copper, gold, and platinum surfaces by using a femtosecond laser ablation technique (14 Optics Express 2164, 2006).

While the prior art discussed above provides important advantages, it suffers from a number of drawbacks. The prior art fails to disclose a method of producing periodic arrays of pillar structures on a surface of a material by texturing the surface. Further, the prior art does not teach a method of texturing and crystallizing a surface in one step. Also, the prior art does not teach a method of forming pillar structures on metal surfaces. In addition, the prior art fails to disclose a method of utilizing laser texturing and crystallization in many novel applications.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above.

The present invention provides a method for texturing a surface of a semiconductor material, including providing an etching gas in an area around the surface of the material, irradiating a portion of the surface with short laser pulses, and translating at least one of the surface and a laser beam to allow the short laser pulses to impact another portion of the surface. This method produces a periodic array of pillar structures on the surface, resulting in changes in properties of the surface.

According to an aspect of the present invention, the method additionally produces nanospikes atop the pillar structures.

Also, the present invention provides a method for texturing a surface of a semiconductor material, including providing an etching gas in an area around the surface of the material; irradiating a portion of the surface with short laser pulses while simultaneously crystallizing the portion of the surface; and translating at least one of the surface and a laser beam to allow the short laser pulses to impact another portion of the surface. This method produces pillar structures on the surface, resulting in changes in properties of the surface.

In addition, the present invention provides a method for texturing a metallic surface, including irradiating a portion of the metallic surface with short laser pulses, and translating at least one of the surface and a laser beam to allow the short laser pulses to impact another portion of the surface. This method produces pillar structures on the surface, resulting in changes in properties of the surface.

An aspect of an embodiment of the present invention provides a method for micro texturing a surface of a material. The method may comprise: providing a gaseous or vacuum environment in an area around the surface of the material; irradiating a portion of the surface with short laser pulses; and moving at least one of the surface or a laser beam relative to each other to allow the short laser pulses to irradiate the surface; wherein the method produces a periodic array of micro pillars, semi-periodic array of micro pillars, or a non-periodic array of micro pillars on the surface, resulting in changes in properties of the surface; wherein nanospikes are produced atop the micropillars; wherein the laser pulses have a duration of between one nanosecond and one microsecond. The material may comprise at least one of metal, alloys, semiconductor, ceramic, glasses and polymer, or any combination thereof.

BRIEF DESCRIPTION OF THE DRAWINGS

The above and other aspects of the present invention will be better understood from a consideration of the following detailed description of exemplary embodiments of the present invention, and the accompanying drawings, in which:

FIG. 6 illustrates graphical results of an X-ray diffraction pattern for an a-Si:H surface, with FIG. 6(a) illustrating the results for an untreated sample, and FIG. 6(b) illustrating the results for a treated sample, according to an exemplary embodiment of the present invention;

FIG. 10 illustrates results of X-ray photoelectron spectroscopy (XPS) measurements of a-Si:H surfaces, with FIG. 10(a) illustrating the XPS measurement of untreated control surfaces, FIG. 10(b) illustrating the XPS measurement of treated surfaces, and FIG. 10(c) illustrating depth profiles of oxygen concentration for untreated control and treated surfaces, according to an exemplary embodiment of the present invention;

Figure 22A:
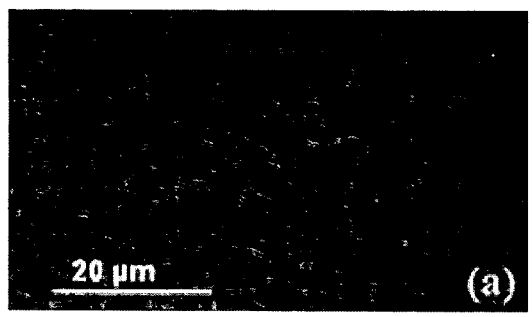
FIG. 22 illustrates SEM images viewed at 45° from the surface normal, with FIG. 22(a) illustrating a treated SiC surface, FIG. 22(b) illustrating a treated GaAs surface, FIG.
Figure 22B:
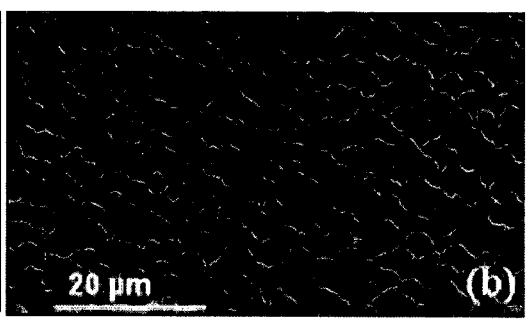
Figure 22C:
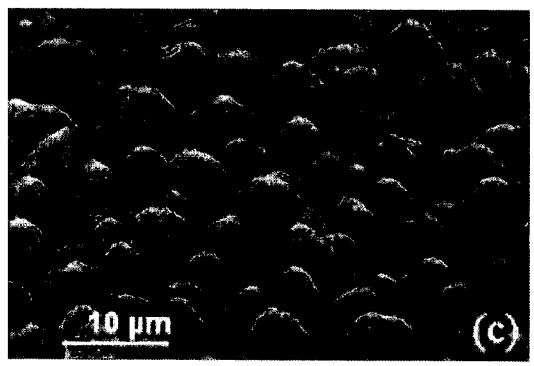
Figure 22D:
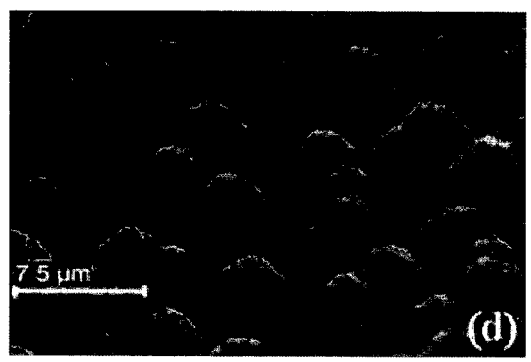
Figure 23:
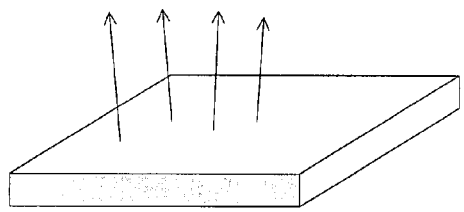
Figure 24:
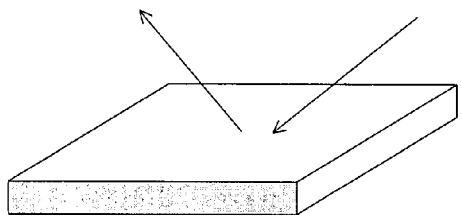
Figure 25:
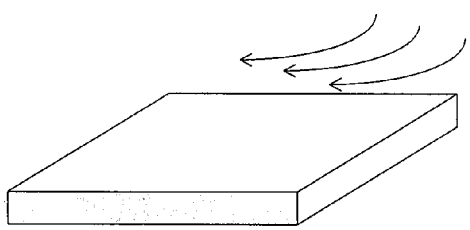
Figure 26:
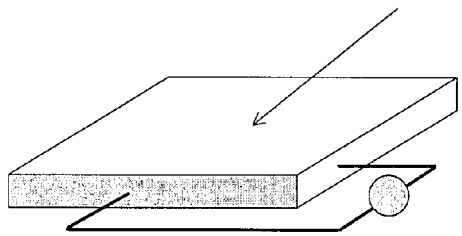
Figure 27:
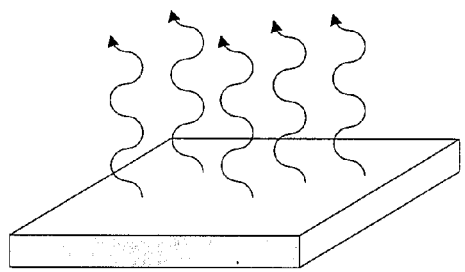
Figure 28:
Figure 29:
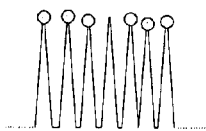

22(c) illustrating a treated titanium surface, and FIG. 22(d) illustrating a treated stainless steel surface, according to exemplary embodiments of the present invention;

FIG. 23 is a schematic representation of field emission from the treated surface, according to exemplary embodiments of the present invention;

FIG. 24 is a schematic representation of reflectivity and absorption of the treated surface, according to exemplary embodiments of the present invention;

FIG. 25 is a schematic representation of the effect on external flow by the treated surface, according to exemplary embodiments of the present invention;

FIG. 26 is a schematic representation of photovoltaic and photodetection applications using the treated surface, according to exemplary embodiments of the present invention;

FIG. 27 is a schematic representation of heat dissipation using the treated surface, according to exemplary embodiments of the present invention;

FIG. 28 is a schematic representation of surface marking created by surface alternations, according to exemplary embodiments of the present invention; and FIG. 29 is a schematic representation of the placement of chemical or biochemical materials at the tips on the treated surface, according to exemplary embodiments of the present invention.

DETAILED DESCRIPTION OF EXEMPLARY EMBODIMENTS OF THE INVENTION

In describing an exemplary embodiment of the present invention illustrated in the drawings, certain specific terminology will be used for the sake of clarity. However, the invention is not intended to be limited to that specific terminology, and it is to be understood that the terminology includes all technical equivalents that operate in a similar manner to accomplish the same or a similar result.

Apparatuses and methods consistent with the present invention texture and crystallize the surface of a material in one step by exposing the surface of the material to an ultrafast laser. In order to expose an area of the surface that is larger than the beam spot size, the material may be translated relative to the laser. The texturing causes pillars to form on the surface of the material, increasing the light absorption of the treated material. Pillars are height variations over a surface, including valleys and hills. Pillars can be formed in a variety of shapes, including conical, arrowhead, pyramid, and spheroid structures. The top of the pillar has a narrower diameter than the bottom of the pillar. Additionally, crystallization increases the electrical conductivity of the treated material. Texturing and crystallizing the surface of the material in a single step allows for faster manufacturing and lower costs than performing these steps separately.

The texturing and crystallization may be performed under atmospheric conditions, or while the material to be treated is in a non-atmospheric gaseous environment. In such a gaseous environment, additional surface texturing will occur through chemical etching. Sulfur hexafluoride and hydrogen chloride gases have been examined, and have been shown to be suitable gases in which to perform the surface texturing. Hydrogen chloride is advantageous over sulfur hexafluoride, because when sodium hexafluoride is used, impurities in the material may result. In contrast, when hydrogen chloride is used, no impurities are created, and the material remains in its pure form. It is to be understood that other gases may also be used. Surface texturing and crystallization have also been achieved in a helium gas environment and in a vacuum.

The materials that have undergone surface texturing and crystallization are also within the scope of the present invention. For amorphous materials, the surface will become textured and the material will become crystallized. Hydrogenated amorphous silicon has been examined using the method of the invention, and has been shown to be well-suited to benefit from this method. Thin-film, poly-crystalline, and single crystal materials may also be used. These materials will benefit from the surface texturing methods of the present invention. Silicon and germanium have been studied, and have been shown to be suitable materials to undergo the laser treatment method in the presence of sodium hexafluoride gas and hydrogen chloride gas. Metals, dielectrics, and polymers have also been shown to be suited to be textured using the method of the present invention. However, it is to be appreciated that other materials are suited to undergo the laser treatment methods of the present invention.

Additionally, the use of materials that have undergone the treatment methods of the present invention is within the scope of the present invention. The present invention has many useful applications. The methods described herein will provide for a material with a higher light absorption capacity and a higher electrical conductivity than an untreated material. These two properties are desirable in photovoltaic applications. Enhanced light trapping capabilities are also useful in photo-sensing applications. Photodetectors utilizing the present invention will be more sensitive to light, and will be able to detect a broader spectrum of electromagnetic waves.

The surface texturing greatly enhances the heat transfer capability of a given material. A material that has been textured can dissipate more heat through convection because of the increased surface area of the material that is exposed to a fluid flowing over the material. Additionally, the texturing will ensure a turbulent flow of the fluid, which is advantageous in convection heat transfer. For radiation heat transfer, the increased surface area will allow for more heat dissipation.

In an exemplary embodiment of the present invention, the surface alteration process was performed on hydrogenated amorphous silicon (a-Si:H), in particular a-Si:H thin films. Thin films with thicknesses from 1.5 to 2 µm were deposited on glass substrates, using a low temperature Plasma Enhanced Chemical Vapor Deposition (PECVD) technique. The a-Si:H films were deposited at a rate of around 1 Å/s in a hydrogen diluted silane environment at about 200° C. The samples were then treated using a femtosecond Ti:Sapphire laser system (Spectra-Physics Spitfire). The laser system delivered pulses at a repetition rate of 1 kHz, with a pulse energy that could vary from 0-1.2 mJ, and a wavelength of 800 nm. The wavelength of the laser can also be frequency doubled or halved to achieve wavelengths from 200 to 1600 nm. The temporal profile of the pulses was measured to be 110 fs using a background free, scanning second-order autocorrelator. The sample was placed on a stationary stage, and the laser beam was deflected by a Scanlab galvo-head to scan the sample surface. The beam spot on the sample surface was circular, with a beam diameter of 0.5 mm. The beam scanning speed was around 12.5 cm/sec. Scanning electron micrographs of treated and untreated surfaces of the a-Si:H films were taken using a Cambridge Instruments high resolution electron microscope for a surface texture study. Surface roughness and formation of spikes in the treated films were also examined with an atomic force microscope (Digital Instruments Nanoscope III).

The optical transmission and reflection of a 20 mm×30 mm laser treated area of the sample was measured using a PERKIN-ELMER LAMBDA 9 spectrophotometer. The reflectance and transmittance percentages were then used to obtain the absorption percentage in the material: A=100−R−T Light from a He—Ne laser source was incident on the treated sample at different angles, and the scattered light was measured by a silicon sensor with an active region of around 4 cm² to estimate the scattering of light due to texturing. It was observed from the measurements that scattering might contribute to a 5-10% variation in the reflection measured by the spectrophotometer. In addition to the optical properties, X-ray diffraction (XRD) was performed on the untreated and laser treated samples to study the structural modification induced by the laser treatment. The Rigaku Miniflex 2005 X-ray diffractometer with a Cu target ($CuK_\alpha$-line) was used for the XRD measurements. The grain size of the treated films was estimated from the X-ray data. Also, the oxygen incorporation into silicon films during this ultrafast laser treatment was studied using a Physical Electronics Inc. 560 XPS/SAM spectrophotometer with a dual source anode (Mg/Al) radiating 1253.6 eV X-ray photons.

Figure 1:
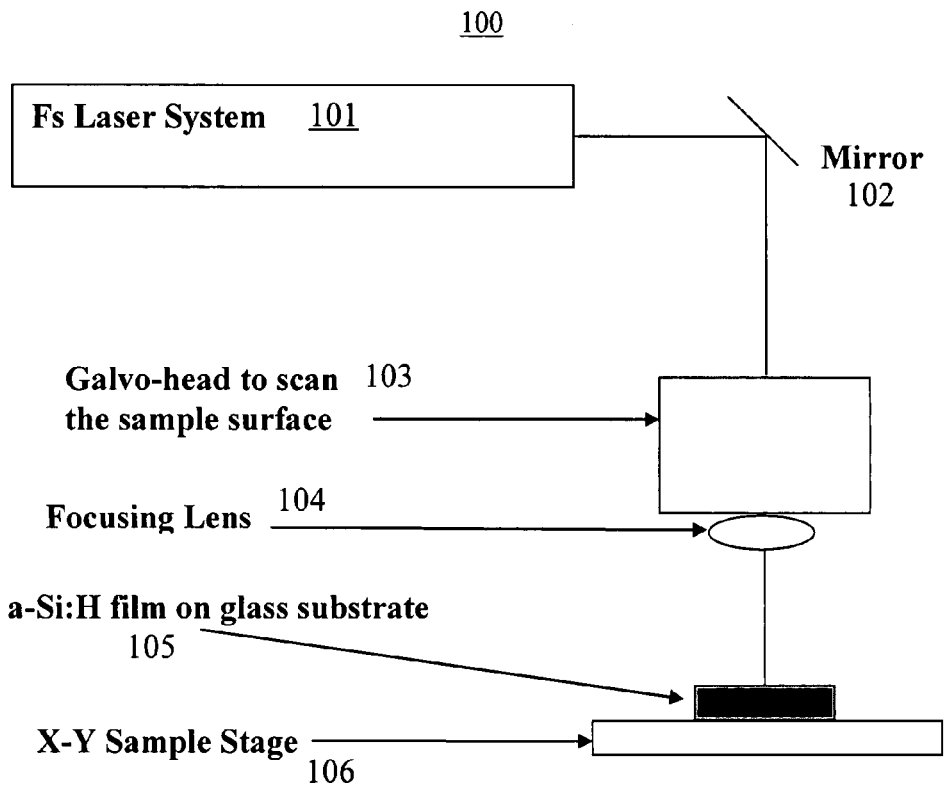
FIG. 1 illustrates the components in a surface modification system, according to an exemplary embodiment of the present invention.
Figure 2:
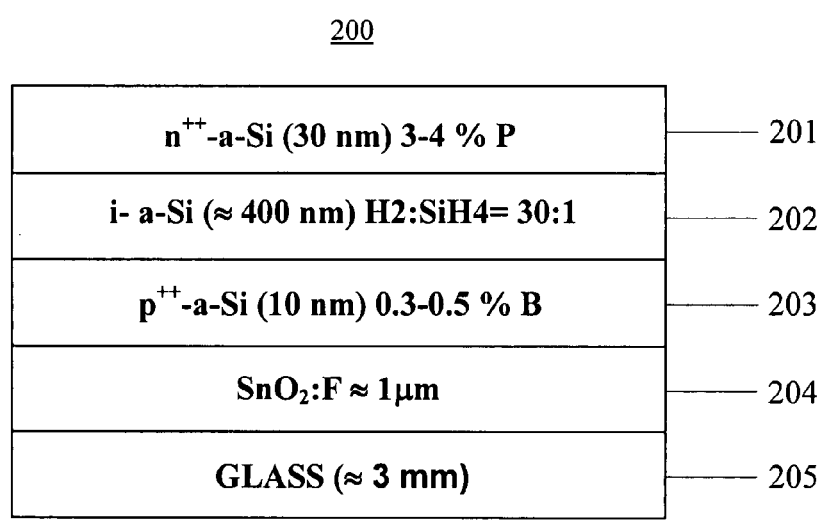
FIG. 2 illustrates an example of a sample material to which surface modification is performed, according to an exemplary embodiment of the present invention.

FIG. 1 shows an exemplary system 100 that can be used to provide surface modifications. The femtosecond laser system 101 provides a laser pulse incident on the a-Si:H sample 105, which is supported by an X-Y sample stage 106. The system 100 uses a mirror 102 to direct the laser pulse to a galvo-head unit 103, which scans the sample surface. A focusing lens 104 is used to focus the pulses on the surface. An exemplary a-Si:H sample 200 is illustrated in FIG. 2, with a glass slide 205, an intervening layer 204, and amorphous silicon layers 201-203.

Figures 3A, 3B:
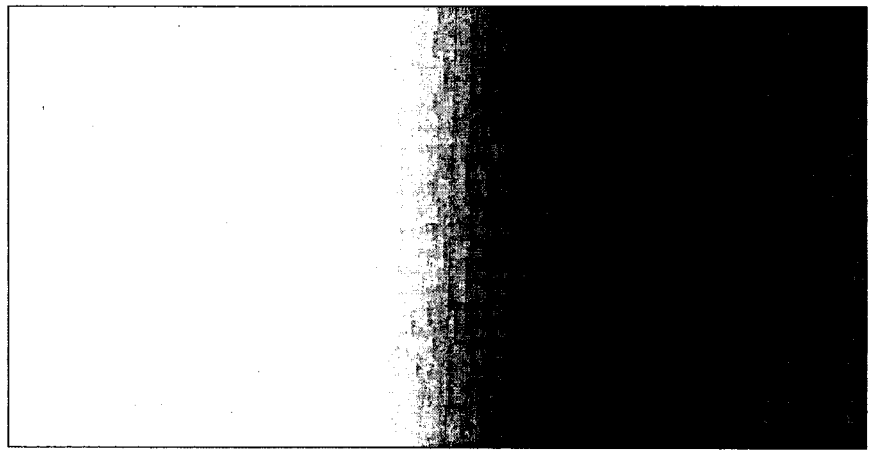
FIG. 3 is a photograph of a hydrogenated amorphous silicon (a-Si:H) surface, with FIG. 3(a) illustrating a non-modified portion, and FIG. 3(b) illustrating a modified portion, according to an exemplary embodiment of the present invention.
Figures 4A, 4B:
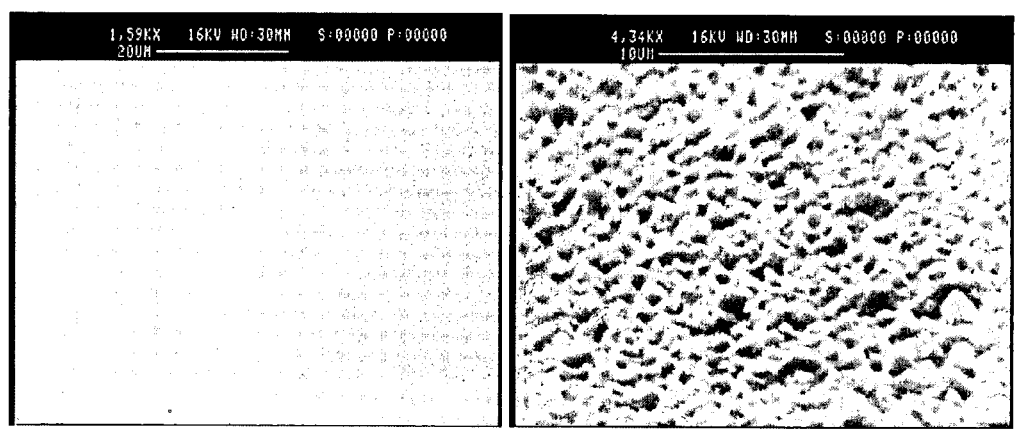
FIG. 4 illustrates scanning electron microscopy (SEM) images of an a-Si:H surface, with FIG. 4(a) illustrating a non-modified portion, and FIG. 4(b) illustrating a modified portion, according to an exemplary embodiment of the present invention.

FIG. 3 illustrates that the change in the surface of the a-Si:H film deposited on the glass substrate can be observed optically. FIG. 3(a) shows a photograph of the untreated surface, and FIG. 3(b) shows a photograph of the treated surface. After treatment, the a-Si:H films turned completely dark, in contrast with their original shiny reddish gray color. FIG. 4(a) shows an SEM image of the untreated surface, and FIG. 4(b) shows an SEM image of the treated surface. FIG. 4(b) shows that microstructures and small spikes have been spontaneously formed upon laser treatment.

Figure 5A:
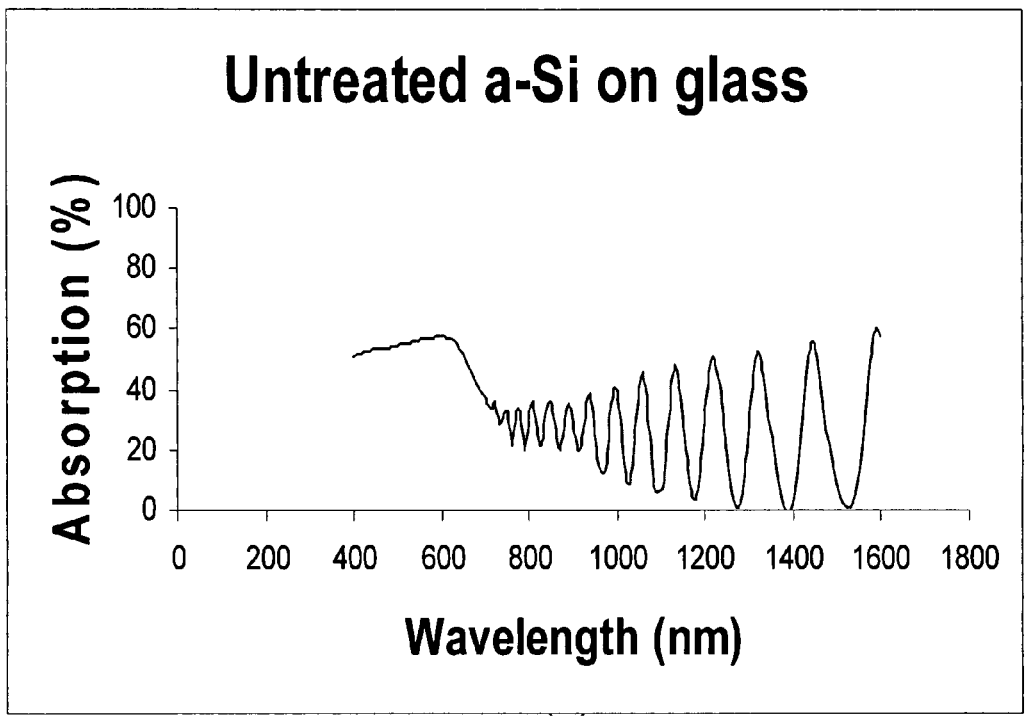
FIG. 5 illustrates graphical results of absorption versus wavelength for an a-Si:H surface, with FIG. 5(a) illustrating the absorption for an untreated sample, and FIG. 5(b) illustrating the absorption for a treated sample, according to an exemplary embodiment of the present invention.
Figure 5B:
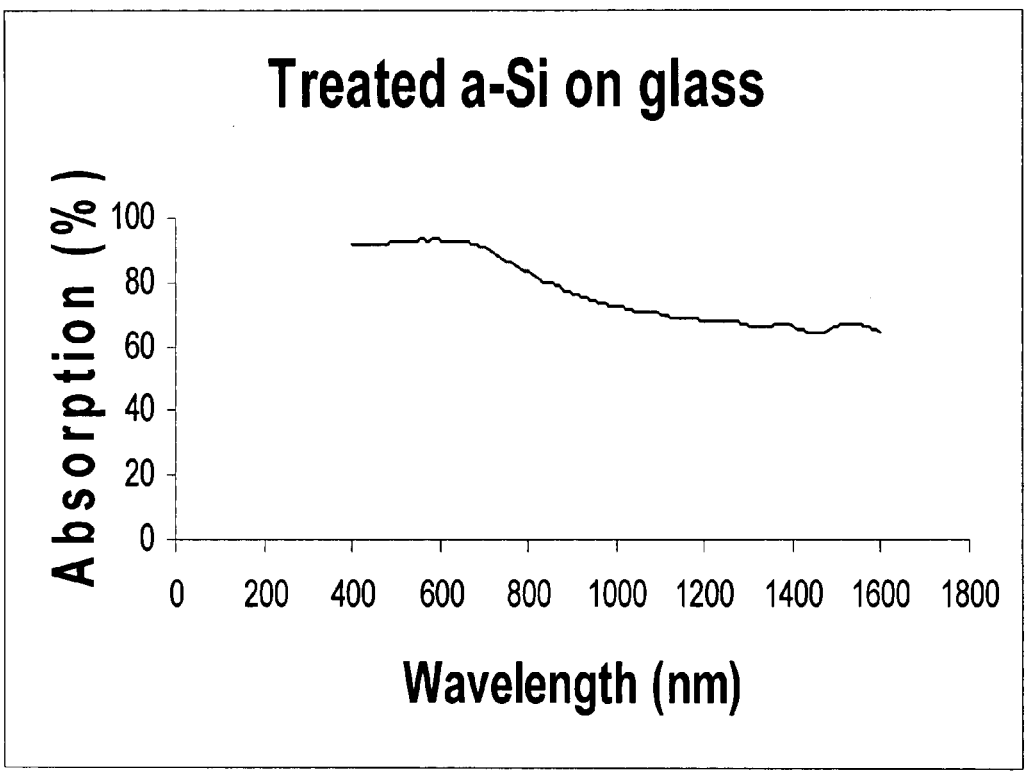

In order to study the optical characteristics, the reflectance and transmittance of a treated 20×30 mm² area were measured using a spectrophotometer. FIG. 5 shows the absorptance of treated and untreated a-Si:H films. FIG. 5(b) that there is a significant enhancement in the optical absorption below a-Si:H band gap (1.7 eV) for treated films, when compared to the untreated films in FIG. 5(a). Since the experiments were carried out under atmospheric conditions, XPS spectra of a treated sample (FIG. 10(b)) and an untreated control sample (FIG. 10(a)) were also obtained. $SiO_x$ formation was observed in the treated sample. The oxygen concentration was estimated by taking XPS measurements at different depths of the sample. Depth profiles of the oxygen concentration in the treated and untreated control samples are shown in FIG. 10(c). Traces of oxygen were observed up to a depth of around 50 nm in treated samples, compared to a depth of 10 nm in the untreated control sample. The samples appeared to be pitch black after treatment, and it is suggested that the below-band edge absorption might be due to trapping the light, which is caused by multiple reflections from the textured surface. Also, structural defects induced during the micro-structuring process most likely produce bands of defect and impurity states in the bandgap, and further enhance the overall absorption.

FIG. 6(a) shows the X-ray diffraction pattern for an untreated a-Si:H sample, and FIG. 6(b) shows an X-ray diffraction pattern for a treated a-Si:H sample. Peaks around $2\theta=30°$ and 56° are observed for the treated sample. These peaks are absent in the untreated control sample, indicating a structural change after laser treatment. The X-ray wavelength used for these measurements was the $CuK_\alpha$ line at 1.54 Å. The observed peaks are due to the (111) and (311) orientations of crystalline silicon. Regardless of the fluence conditions, the (111) orientation dominated in the crystallized films, as the (111) plane has least surface energy. Dominant (111) and (311) peak formation is typically observed in nanosecond laser crystallization. The (111) peak was fitted with a Gaussian curve and the full width at half-maximum (FWHM) was determined. The particle size was determined to be around 85 nm using the Scherrer's formula: $L=k*\lambda/\Gamma \cos\theta$; where $\lambda$ is the X-ray wavelength for measurement; $\Gamma$ is the X-ray line width (FWHM) (measured in radians); $\theta$ is the Bragg angle of diffracted rays (measured in degrees); and k is a constant equal to 0.9.

Figure 7A:
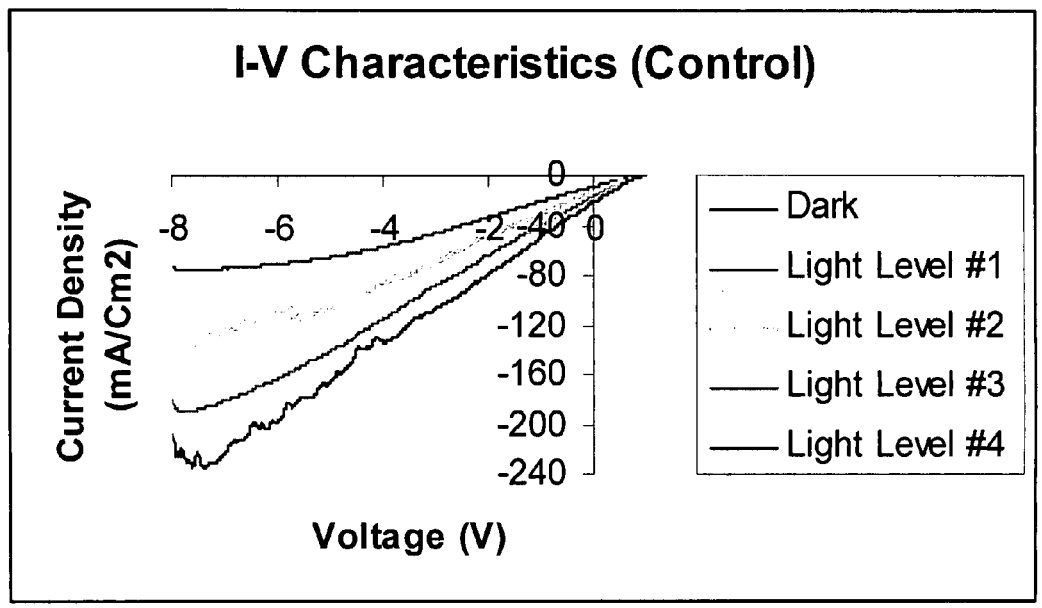
FIG. 7 illustrates graphical results of current versus voltage for an a-Si:H surface with varying light levels, with FIG. 7(a) illustrating the results for an untreated control sample, and FIG. 7(b) illustrating the results for a treated sample, according to an exemplary embodiment of the present invention.
Figure 7B:
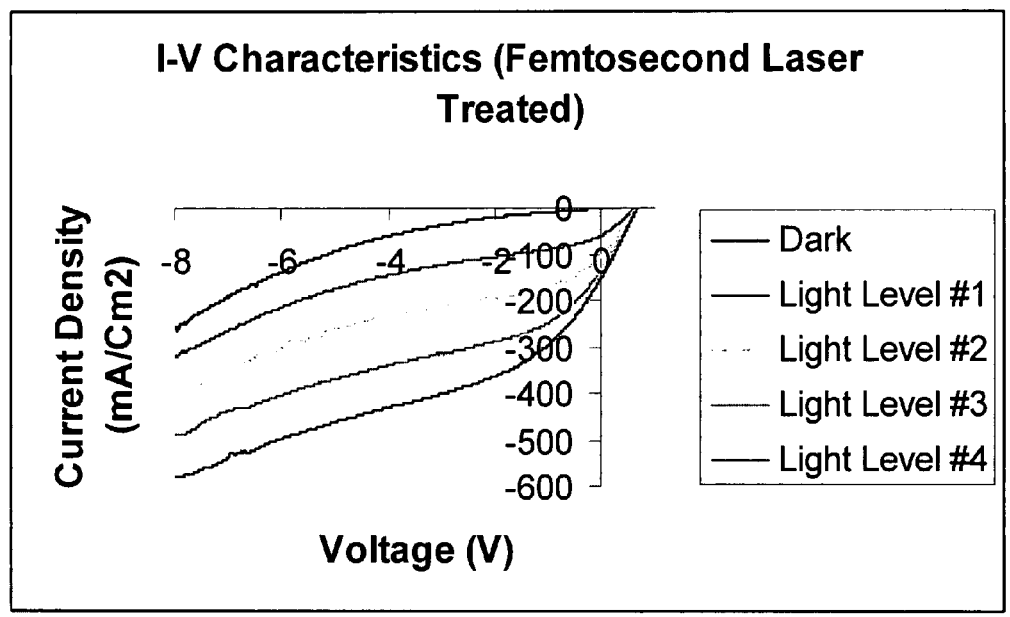
Figure 11:
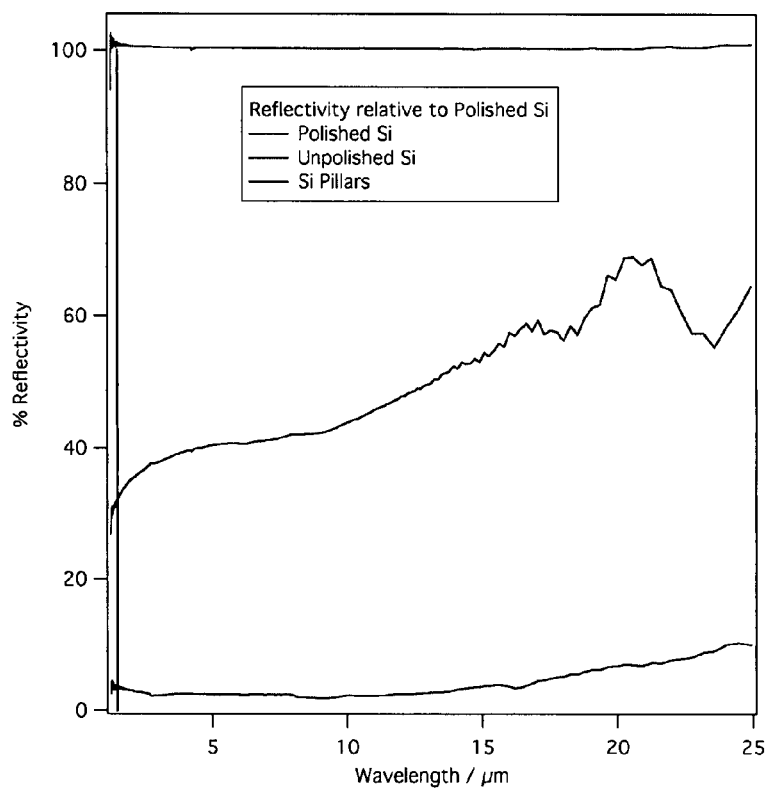
FIG. 11 is a graph illustrating the reflectivity of surfaces of polished silicon, unpolished silicon, and treated a-Si:H surfaces, according to an exemplary embodiment of the present invention.
Figure 12:
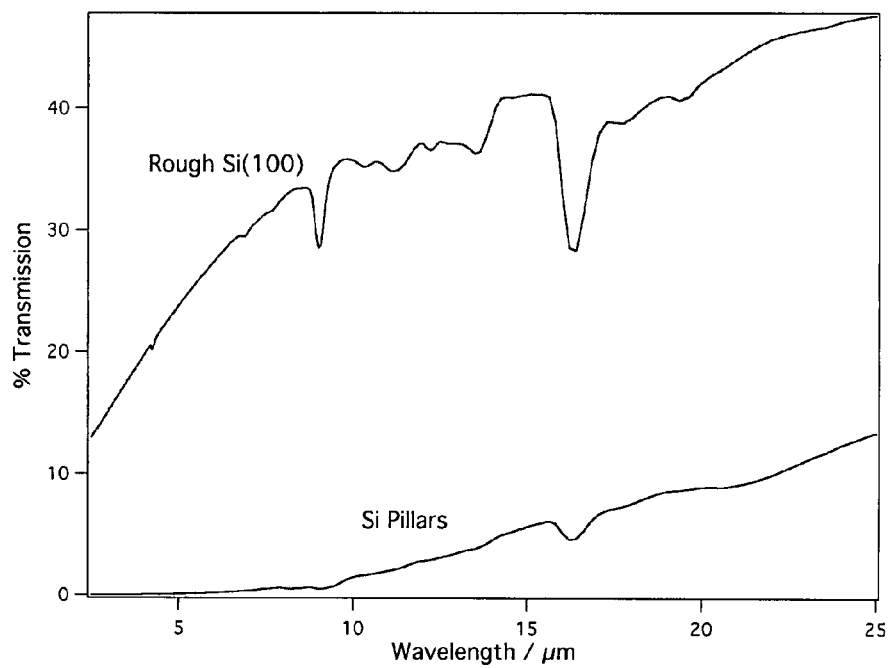
FIG. 12 is a graph illustrating the transmission of samples of unpolished silicon and treated a-Si:H surfaces, according to an exemplary embodiment of the present invention.

The current-voltage characteristics of the treated and untreated a-Si:H samples were also examined, as shown in FIG. 7. FIG. 7(a) shows a graph of the current density as a function of voltage for several light levels for the untreated sample. As illustrated in FIG. 7(b), the current-voltage characteristics change considerably, due to the surface modification and changes in the properties of the material. The transmission and reflectivity of the treated and untreated surfaces were also examined. The reflectivity of polished silicon, unpolished silicon, and treated silicon with pillars is shown in FIG. 11. Similarly, the transmission of the treated silicon versus the rough silicon surface is presented in FIG. 12. The changes in the optical properties shown in FIG. 3 are further substantiated by the changes in reflectivity and transmission as functions of wavelength. These results impact the use of silicon in many applications, as discussed below.

Figure 8:
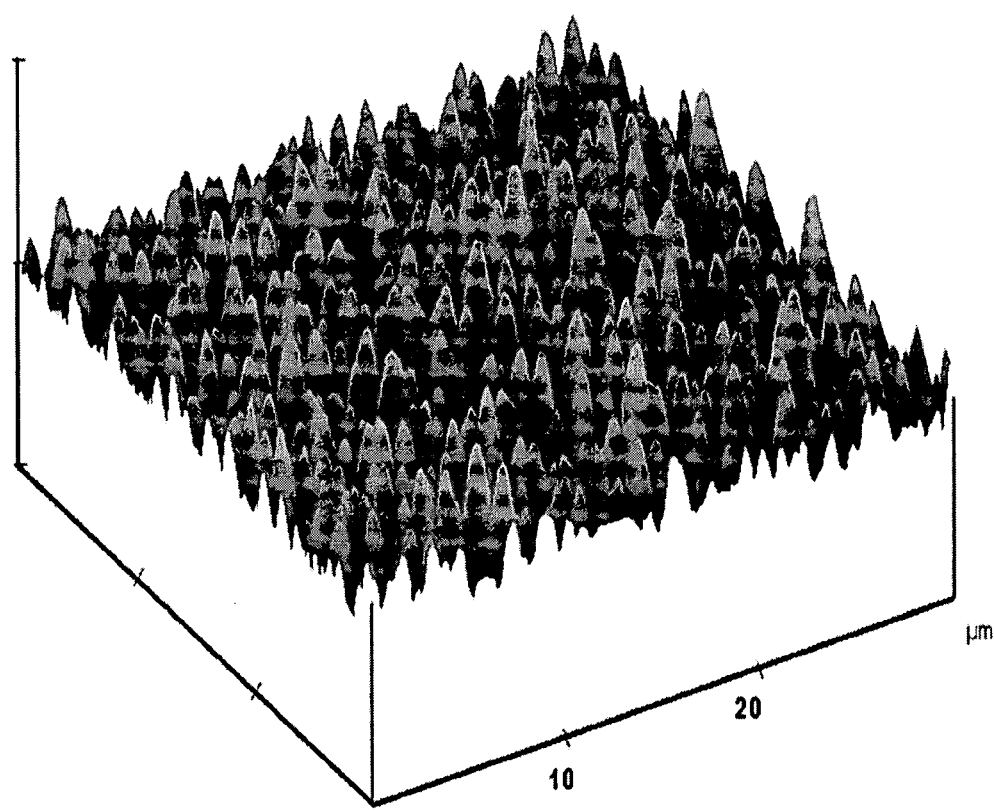
FIG. 8 illustrates an atomic force microscope image of an a-Si:H surface that has been treated according to an exemplary embodiment of the present invention.
Figure 9:
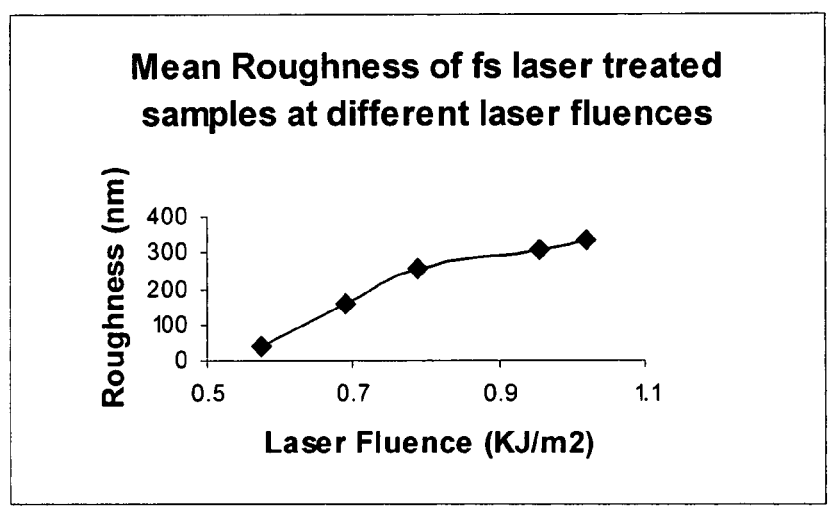
FIG. 9 is a graph illustrating the average roughness of laser treated a-Si:H surfaces at different laser fluences, according to an exemplary embodiment of the present invention.

In order to measure the roughness and spike distribution, atomic force microscopy (AFM) images of the treated a-Si:H samples were obtained. FIG. 8 shows that spikes of a height of about 300 nm were formed, with a spacing between the tips of around 1 μm. The heights of these spikes were found to increase with laser fluence. The average height of the microstructures was 150 nm at a laser fluence of 0.3 J/cm², and the height increased nearly linearly with the laser fluence. Microstructures with a height of around 350 nm were observed at a fluence of 0.5 J/cm². Beyond 0.5 J/cm², the films became very rough, and material ablation deteriorated the texturing. Also, the average roughness of the surface correlates with the laser fluence, as illustrated in the graph in FIG. 9. FIG. 9 shows that the surface roughness increases approximately linearly with the laser fluence.

Increasing the efficiency of a-Si:H thin film solar cells requires more light absorption and a reduction in carrier recombination. A thick i-layer increases the light absorption, but recombination deteriorates the performance. On the other hand, for sufficiently thin film solar cells, the light absorption becomes an issue. Keeping a thin micro or nano crystalline phase with surface texturing could both reduce recombination and improve light trapping. The treated surface had a silicon oxide formation layer of about 50 nm, and was found to be semiconducting. This layer could be used as an n-layer in a p-i-n type solar cell, and an active layer for other optoelectronic devices. The simultaneous formation of light trapping structures and crystallization might find applications in devices such as thin film solar cells, large area sensors, and display devices.

As discussed previously, the femtosecond laser treatment results in the enhancement of optical absorption in a-Si:H thin films. The high absorption of the film is suggested to be due to the light trapping occurring in the silicon spikes formed at the surface after laser treatment, and the structural defects induced during micro structuring process most likely producing bands of defect and impurity states in the band gap. Also, crystallization in the film after femtosecond laser treatment is attributed to a non-thermal ultrafast phase transition and subsequent surface-initiated crystallization. By performing the surface texturing and crystallization as a one-step laser process, optoelectronic devices can be fabricated efficiently.

Exemplary embodiments of the present invention also form nanospiked, nearly periodic microstructures, by exposing a germanium surface to femtosecond laser pulses in a gaseous sulfur hexafluoride ($SF_6$) environment. The microstructures that are formed in germanium have a different aspect ratio than the microstructures formed on silicon. Because reducing light reflection and increasing absorption are key issues in improving optoelectronic device performance, this type of microstructure formation in germanium could lead to the fabrication of highly responsive infrared photodetectors and solar cells. In addition, these textured surfaces might find potential applications in the fabrication of biomedical devices and sensors.

The surface modification of germanium can occur according to the following process. Undoped Ge (100) wafers are cleaved into small chips and ultrasonically cleaned with acetone and methanol. One or more chips are put on a stage inside a vacuum chamber with a base pressure of around 1 mTorr, which is mounted on a high-precision computer-controlled X-Y stage. The chamber is rinsed with $SF_6$ at least twice, and then backfilled with $SF_6$ at 400 mbar. The samples are exposed to 1.4 mJ pulses of light with a wavelength of 800 nm, a pulse duration of 130 fs, and a repetition rate of 1 kHz from a regeneratively amplified Spectra-Physics Ti-sapphire laser system. The wavelength of the laser can be frequency doubled or halved to achieve wavelengths from 200 to 1600 nm. Short laser pulse widths can also be used, including 1 fs to 1 μs pulses. Ultrafast laser pulses are a subcategory of short pulses, and can range from 1 femtosecond to hundreds of picoseconds. The laser beam is focused along the surface normal onto the sample surface by a coated lens with a focal length of 1 m, and the laser fluence is adjusted with a Glan laser calcite polarizer.

The spatial profile of the laser pulse is nearly Gaussian, but is elongated in one axis, creating an elliptical profile. The fluence is calculated by using the laser spot size, which is determined by exposing a point on the sample surface to thousands of shots. In order to scan an area that is bigger than the laser spot size, the samples are translated using a motorized X-Y stage. Scanning also assists in making the surface structure more uniform by smoothing out any shot-to-shot irregularities in the beam profile. By varying the scanning speed of the X-Y stage, the number of laser pulses impinging on the sample surface at a particular location is controlled. The spot size is 0.3 mm along the minor axis and 0.6 mm along the major axis. Scanning is performed parallel to the minor axis.

Samples are produced with isolated single line scans, or with large areas created by overlapping several line scans. The step size between the scan lines is chosen to be sufficiently small (generally 0.38 mm), so that successive lines overlap substantially. This further improves layer homogeneity. Homogeneity is further enhanced by performing two overlapping scans in orthogonal directions, rather than one overlapping scan with an exposure of the same total number of shots. After laser processing, the samples are analyzed with a scanning electron microscope (Zeiss SUPRA 40).

FIG. 13 shows an SEM image at increasing levels of magnification, viewed at 45° from the surface normal line of a germanium surface after exposing the surface to femtosecond laser pulses. Sharp conical structures with nanospikes are formed when the sample is under a pressure of 400 mbar $SF_6$, and is scanned by a laser beam with a fluence of about 0.6 $J/cm^2$. FIG. 13 shows that these structures are almost regular in position, are 10 to 15 μm tall, and have a base diameter around 5 μm, which tapers down to around 100 nm near the tip. The areal density of pillars in FIG. 13(a) is 0.027 $μm^{-2}$, which corresponds to a mean spacing of roughly 6 μm between pillars. The sizes of the microstructures vary across the scanned line, indicating a response to the spatial profile of the laser pulse. In the region of low fluence towards the edge of the irradiated line, the structures have a smaller height and are more densely packed than in the center.

Figure 13A:
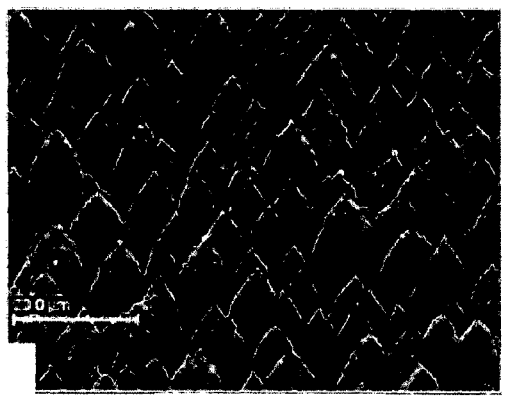
FIG. 13 illustrates SEM images of germanium surfaces, with FIG. 13(a) illustrating an SEM image viewed at 45° from the surface normal, FIG. 13(b) illustrating a higher magnification SEM image showing nanospikes formed on each germanium pillar, FIG. 13(c) illustrating a single nanospike of a treated sample, and FIG. 13(d) illustrating a nanotip formed after brief chemical etching, according to exemplary embodiments of the present invention.
Figure 13B:
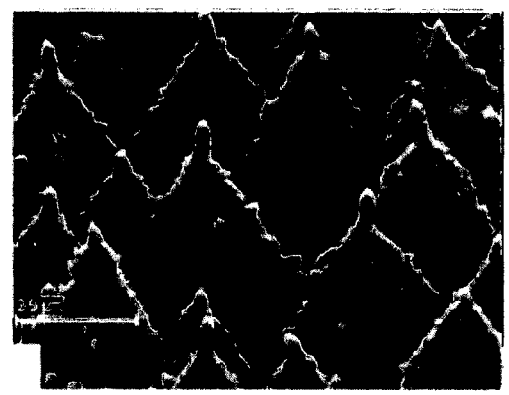
Figure 13C:
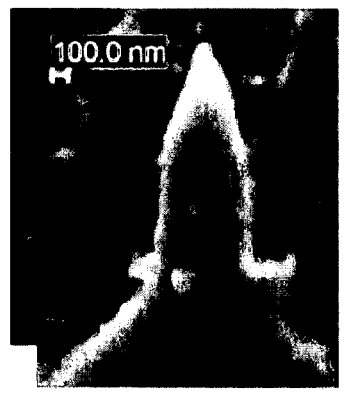
Figure 13D:
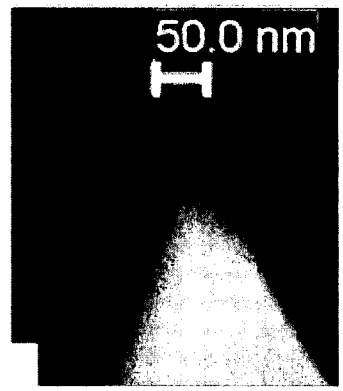
Figure 14A:
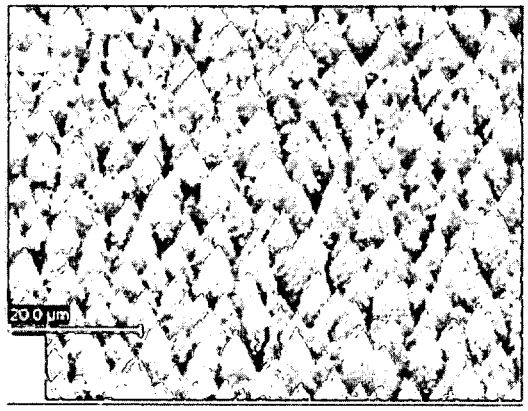
FIG. 14 shows a comparison of SEM images viewed at 45° from the surface normal of Ge (100) surfaces irradiated at different laser power levels, with FIG. 14(a) showing a surface irradiated with a laser power of 0.66 $J/cm^2$, FIG. 14(b) showing a surface irradiated with a laser power of 0.56 $J/cm^2$, FIG. 14(c) showing a surface irradiated with a laser power of 0.3 $J/cm^2$, and FIG. 14(d) showing a surface irradiated with a laser power of 0.2 $J/cm^2$, according to embodiments of the present invention.
Figure 14B:
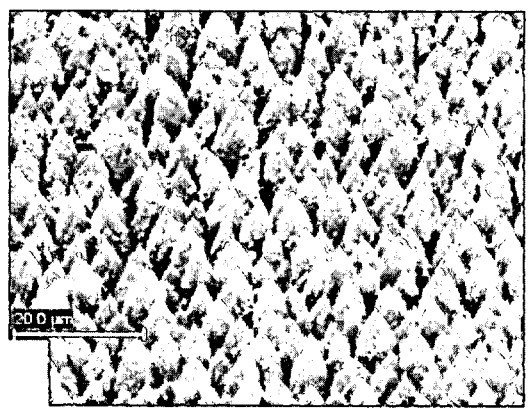
Figure 14C:
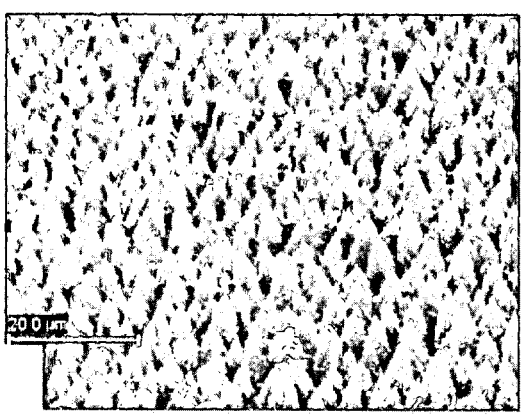
Figure 14D:
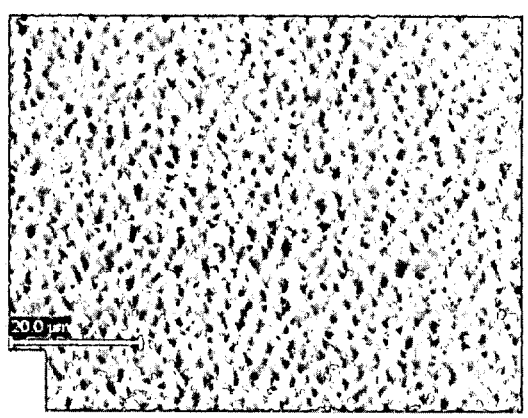

FIG. 13(b) shows that the microstructures have two distinct features: (a) a conical shape (b) that is crowned with a very sharp spike, which has a radius of about 400 nm (about 100 nm at the tip), and is up to about 2 μm long (see FIG. 13(c)). The tips can be sharpened further by a brief chemical etching with 100 ml $H_2O_2$ (10 vol %), 8 g NaOH for 10 seconds at room temperature. Alternatively, the tips can be sharpened further by ion etching, including etching with an Argon ion beam. Nanoclusters, which are formed during laser ablation and deposited on the surface, are also evident from FIG. 13(b).

The SEM images of FIG. 14 show the effect of laser fluence on the surface texturing of germanium. In this figure, the average number of laser shots at each point on the sample surface is 400. The germanium surface in FIG. 14(a) was irradiated with laser pulses with a fluence of 0.66 $J/cm^2$, and the germanium surface in FIG. 14(b) was irradiated with laser pulses with a fluence of 0.56 $J/cm^2$. In contrast, the germanium surface in FIG. 14(c) was irradiated with laser pulses with a fluence of 0.3 $J/cm^2$, and the germanium surface in FIG. 14(d) was irradiated with laser pulses with a fluence of 0.2 $J/cm^2$. FIG. 14(d) shows that texturing is observed at fluences as low as 0.2 $J/cm^2$, resulting in features are smaller in width and height, less regular, less smooth, and densely populated, with very tiny or no spike formation. However, for higher fluence conditions, such as those in FIGS. 14(a) and 14(b), the structures are more well-developed, sharper, and more conical, and spike-formation takes place atop the pillars. Also, increasing the number of laser shots from 400 to 600 and keeping the fluence almost the same wipes out all the spikes.

Germanium expands upon freezing. When a shell of germanium material starts freezing and expanding, it exerts pressure on the liquid trapped inside, causing the liquid to shoot upward and solidify to form nanospikes. As Mills and Kolasinski disclose, in order to obtain nanospikes in silicon, it is necessary to dilute the $SF_6$ with He. This reduces the chemical etching that results from the interaction of fluoride with the silicon surface. If the etching is too aggressive, it can remove the nanospikes. In contrast, it is unnecessary to dilute the $SF_6$ in order to obtain nanospikes on a germanium sample, probably because of differences in the chemistry of etching in the F/Ge system compared to the F/Si system. Another possible reason why germanium appears to be more conducive for nanospike formation might be that the thermal conductivity of undoped germanium is less than half of the thermal conductivity of undoped silicon. Therefore, the heat dissipation to the pillar in germanium is slower, and the liquid bulb remains in a molten state for a longer time, as compared to silicon.

Figure 15:
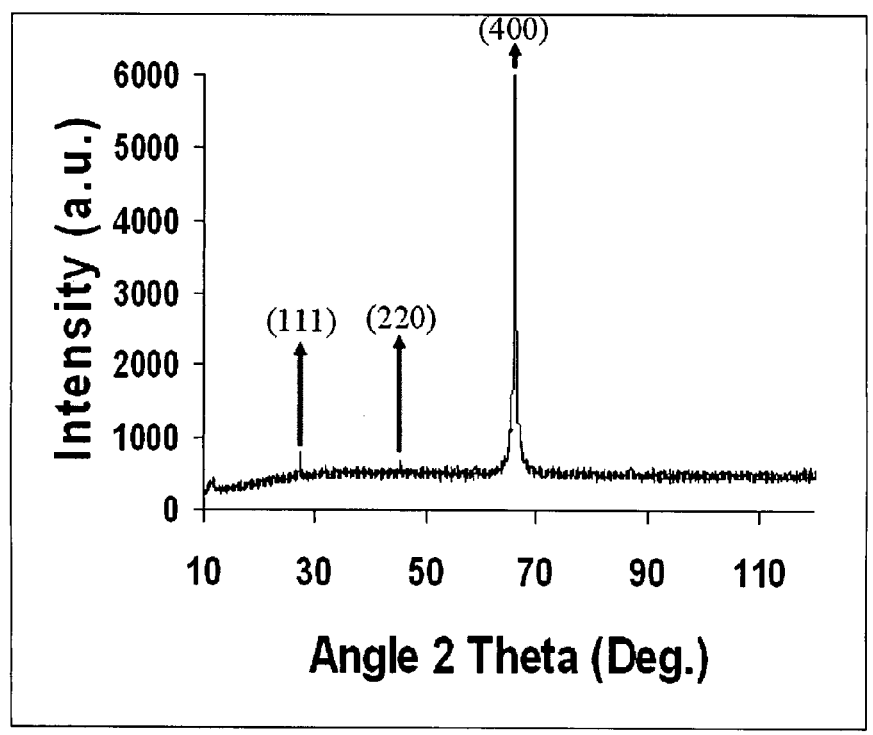
FIG. 15 is graphical representation of an X-ray diffraction pattern of a laser treated germanium surface having nanospikes, according to an exemplary embodiment of the present invention.

In order to investigate the properties of the textured germanium surfaces, an X-ray diffraction study was conducted. FIG. 15 shows an X-ray diffraction spectrum of a laser textured germanium surface. The sharp high-intensity peak corresponds to the (400) plane, because the starting material is Ge (100). However, two relatively weak peaks at (111) and (220) are also observed. This indicates that the textured pillars and the nanospikes remain predominantly crystalline.

Figure 16A:
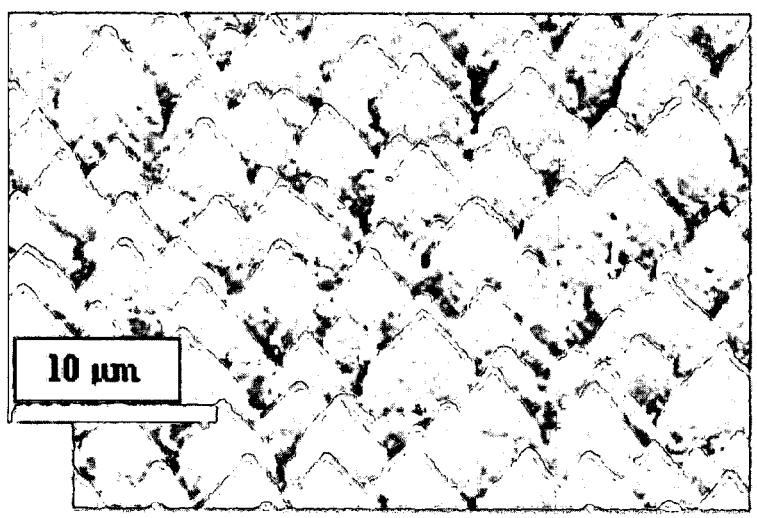
FIG. 16 illustrates SEM images of treated surfaces, with FIG. 16(a) illustrating an image taken towards the edge of the scanned line for a Ge (100) surface, FIG. 16(b) indicating ball formation instead of spikes for a Ge (100) surface, and FIG. 16(c) illustrating an image taken in the middle of the scanned line for a Si (100) surface, according to exemplary embodiments of the present invention.
Figure 16B:
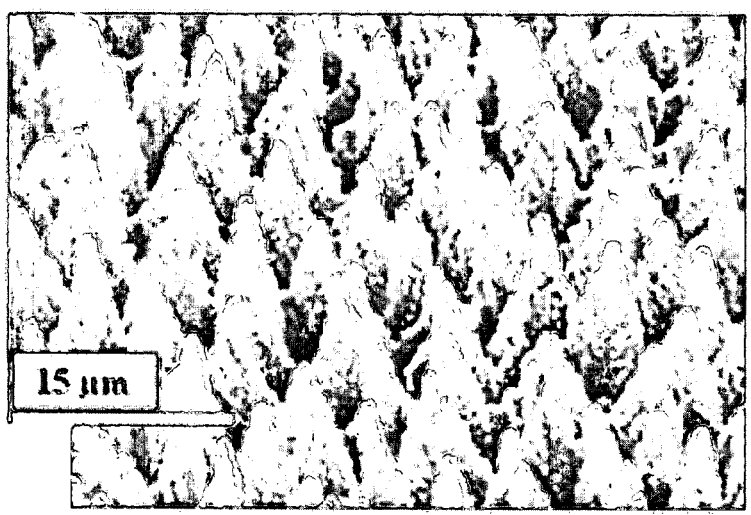
Figure 16C:
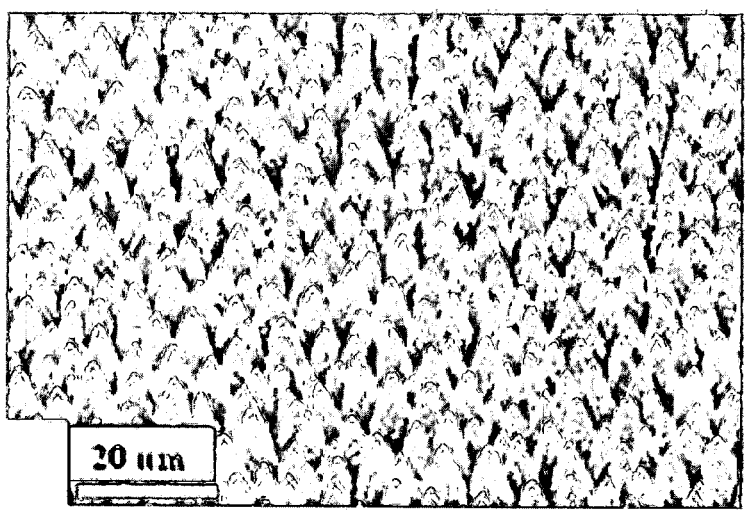

The SEM images of FIGS. 16(a) and 16(b) show the structural formations in germanium, and FIG. 16(c) compares the structural formations in silicon, after laser treatment under similar conditions. For all three samples the laser fluence was around 0.56 J/cm$^2$, the number of laser shots was around 600, the sample was in a gaseous $SF_6$ environment at 400 mbar, and an orthogonal scanning mode was used. The SEM image in FIG. 16(a) was taken toward the edge of the scanned line, while the SEM image in FIG. 16(b) was taken in the middle of the scanned line. FIG. 16 shows that the germanium pillars are not as smooth as the silicon pillars. Also, the aspect ratio, defined as the ratio of the tip height to the tip width, is higher in silicon than germanium for a given laser condition. For example, at a fluence of 0.5 J/cm$^2$, silicon has an aspect ratio of around 200, whereas germanium has an aspect ratio of around 100. Also, as mentioned previously, spikes were not formed on germanium under higher laser shot conditions. However, pillars formed under higher laser shot conditions are taller than pillars formed under fewer shots, as shown in FIGS. 13 and 14. In contrast, silicon shows a well-developed smooth structure under a greater variety of shot conditions.

FIG. 16(a) shows that toward the edge of the laser scanned line on the germanium surface, pyramidal structures were formed, which tend to form a small spherical cap at the top, instead of the nanospikes formed in FIG. 16(b). This spherical cap formation is typical of silicon. The spherical shape of the cap suggests that a liquid germanium drop resolidified before it could spill over the pillar. The lack of nanospikes in FIG. 16(a) might be due to three possible reasons: (a) the fluence is low to achieve the high melting condition necessary for nanospike formation; (b) the higher number of laser shots destroyed nanospikes that were already formed; or (c) an insufficient density of nanostructures was formed. With further regard to (c), deposition of nanoclusters has been implicated in the formation of nanospikes. A sufficient nanoclusters deposition rate is required, and because fewer nanoclusters are formed at a lower fluence, there may be a critical fluence for the formation of nanospikes, not only because a sufficient melt must be formed, but also because a sufficient density of nanoclusters must be created.

Figure 17B:
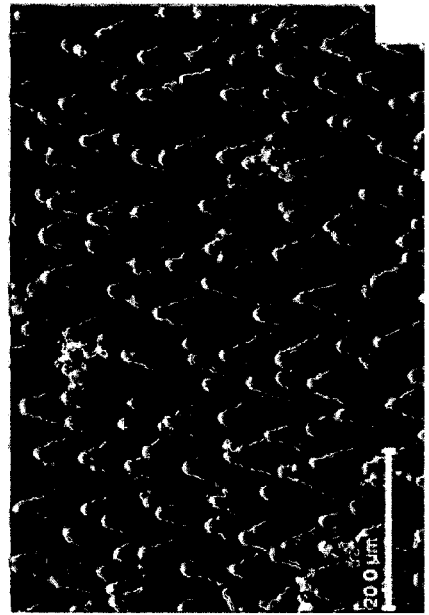
FIG. 17 illustrates SEM images of pillars, viewed at 45° from the surface normal, formed on a silicon surface, with FIG. 17(a) illustrating an $SF_6$ gaseous environment, and FIG. 17(b) illustrating an HCl gaseous environment, according to exemplary embodiments of the present invention.
Figure 17A:
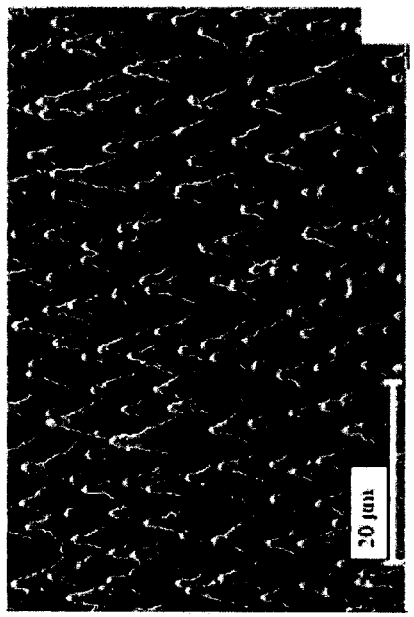

FIG. 17 shows SEM images viewed at 45° from the surface normal of sharp conical pillars formed on the surface of B-doped Si (100) wafers. The pillars were produced with 240 shots of 130-fs laser pulses at a fluence of 0.6 J/cm$^2$. FIG. 17(a) shows the results for a sample in 400 mbar of $SF_6$, and FIG. 17(b) shows the results for a sample in 400 mbar of HCl. The pillar size varies across the scanned laser line, indicating the intensity variation of the laser fluence across the spatial profile of the laser pulse. The scan lines were overlapped to minimize height variation over a large area on the sample surface. The spikes that are obtained in $SF_6$ are around 15 µm tall and have a base diameter of around 5 µm.

On the other hand, the structures formed under similar laser conditions in the presence of HCl are composed of taller and wider pillars, with a height of around 20 µm and a base diameter of around 7 µm. FIGS. 17(a) and 17(b) show that the pillars formed in $SF_6$ are narrower towards the tips, compared to the pillars formed in HCl. Although the pillar density is comparable in both cases, the pillars formed in HCl look stronger and are relatively blunt towards the tip, indicating that differences in the etch chemistry of the F/Si system and the Cl/Si system are responsible for significant structural differences.

The role of chemistry in structure formation is not well understood, and it is a significant result that regular conical pillars are formed during femtosecond irradiation in $SF_6$ as well as HCl. Regular conical pillars can be formed during nanosecond irradiation of silicon in the presence of $SF_6$, but they are not formed for nanosecond irradiation of silicon in the presence of HCl. Nanosecond irradiation of silicon in HCl produces significantly blunter tips, the pillars are much taller, with a height greater than 50 µm, and the pillars are porous, instead of having a solid core. This is a further indication that the mechanisms of pillar formation are different for the femtosecond and nanosecond irradiation regimes. This result is also significant because chemical impurities, namely sulfur, incorporated during laser processing have been implicated in changing the optical and electronic properties of the textured surfaces.

Figure 18B:
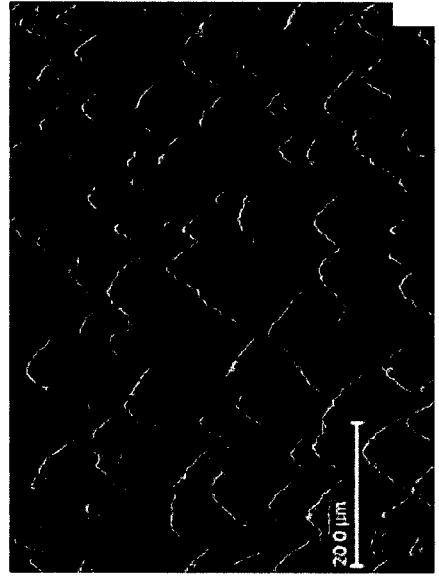
FIG. 18 illustrates SEM images of pillars, viewed 45° from the surface normal, formed on a germanium surface, with FIG. 18(a) illustrating an $SF_6$ gaseous environment, and FIG. 18(b) illustrating an HCl gaseous environment, according to exemplary embodiments of the present invention.
Figure 18A:
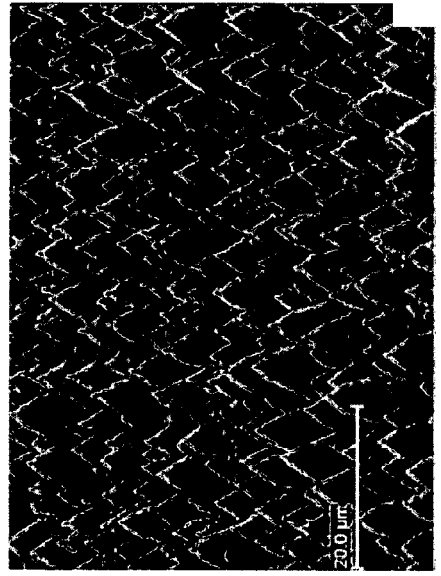
Figure 20A:
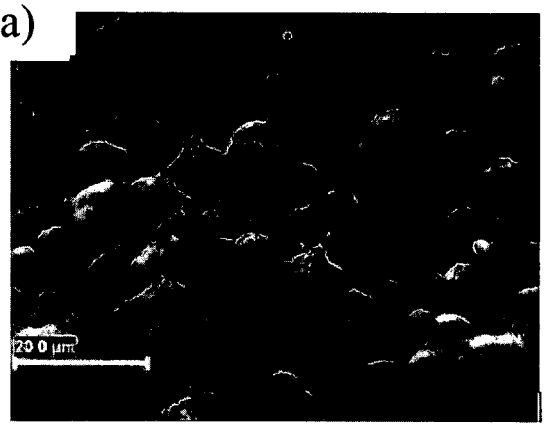
FIG. 20 illustrates SEM images of titanium surfaces, with FIG. 20(a) illustrating a titanium surface treated in air, FIG. 20(b) illustrating a titanium surface treated in vacuum, FIG. 20(c) illustrating a titanium surface treated in helium, and FIG. 20(d) illustrating a titanium surface treated in $SF_6$, according to exemplary embodiments of the present invention.
Figure 20B:
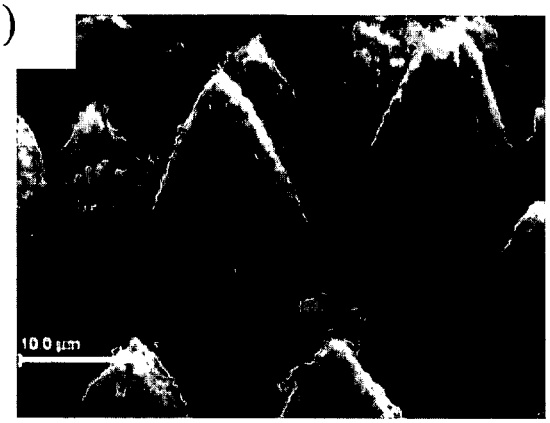
Figure 20C:
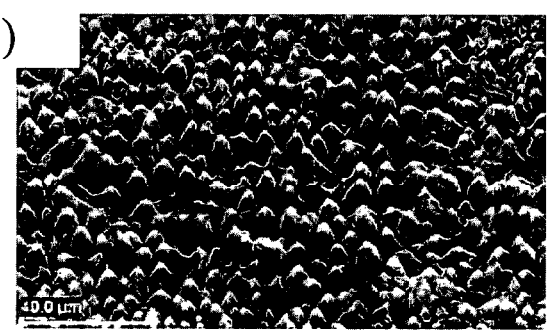
Figure 20D:
Figure 21A:
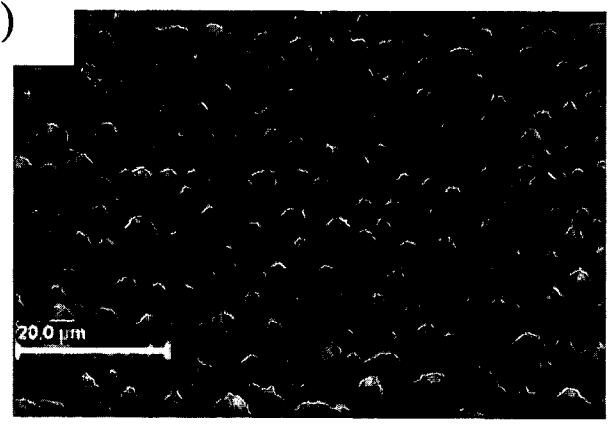
FIG. 21 illustrates SEM images of stainless steel surfaces, with FIG. 21(a) illustrating a stainless steel surface treated in air, FIG. 21(b) illustrating a stainless steel surface treated in vacuum, FIG. 21(c) illustrating a stainless steel surface treated in helium, and FIG. 21(d) illustrating a stainless steel surface treated in $SF_6$, according to exemplary embodiments of the present invention.
Figure 21B:
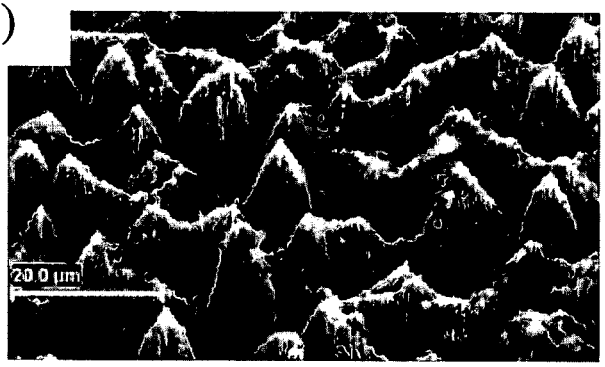
Figure 21C:
Figure 21D:
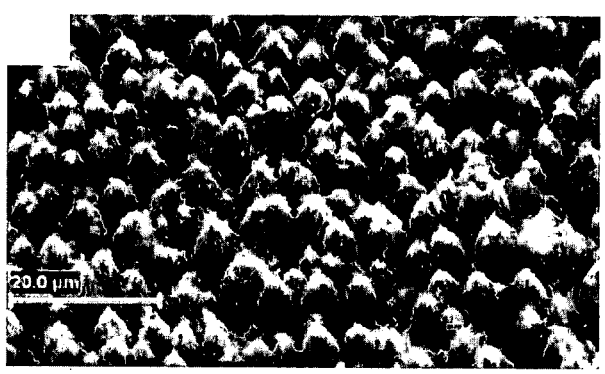

FIG. 18 shows SEM images taken for germanium samples treated under similar laser and gaseous conditions as described above for silicon. A very different surface texturing was created for germanium. FIG. 18(a) shows that for germanium processed in $SF_6$, there were two distinct features that were not observed for silicon treated under similar conditions: (a) conical pillar formation with a higher cone angle up to a neck; and (b) very sharp spikes, up to about 2 µm in length with a tip radius of about 100 nm, formed atop the pillars. Nanoclusters formed during laser ablation are more abundant in germanium than silicon under similar laser conditions, which might be due to the lower melting temperature of germanium. On the other hand, FIG. 18(b) shows that the germanium structures formed in the presence of HCl are less densely populated, shorter, have a higher cone angle and a wider base, and exhibit greater variations in pillar height than the silicon structures shown in FIG. 17(b). Gas phase silicon etching is anisotropic in HCl, and the etch rate is around 20 µm min$^{-1}$ for the (100) plane at temperatures in the range of 1050-1250° C., whereas in germanium the etch rate is around 3 µm min$^{-1}$, the etch rate is independent of temperature beyond 800° C., and etching leads to the development of square pits for the (100) orientation. The differences in etch chemistry are involved in determining the different structure formation dynamics, which result in more regular spike formation in HCl for silicon than for germanium.

Laser induced surface texturing that produces regular structures on materials in the presence of reactive species is a complex process involving: (1) interactions between the plume and the process gas, and the plume and the surface, such as decomposition of the reactive gas, chemical etching enhanced by laser heating of the material and the formation of radicals, and deposition out of the plume; (2) laser ablation of the material; and (3) optical phenomena that initiate the formation of regular structures. The laser parameters, gaseous environment, and nature of the substrate all play a role in the final outcome of the surface morphology. Structure formation is ultimately a convoluted dynamical process involving all three factors. The dimensions and character of the pillars formed in silicon have been shown to depend critically on the temporal pulse width of the laser beam. While pillar production with pulse durations in the range of 100 fs to 20 ns has been demonstrated, with much smaller pillars being formed in the case of femtosecond irradiation, pillars were not producible with a 300 ns Nd:VO$_4$ laser. It appears that laser pulses significantly shorter than the melt lifetime of about 250 ns are required for sharp pillar formation.

Figure 19A:
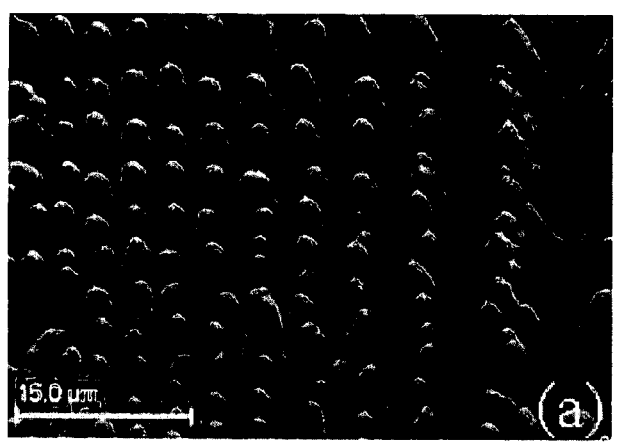
FIG. 19 illustrates SEM images periodic structures formed on a silicon surface, with FIG. 19(a) illustrating a one-dimensional periodic structure, and FIG. 19(b) illustrating a two-dimensional periodic structure, according to embodiments of the present invention.
Figure 19B:
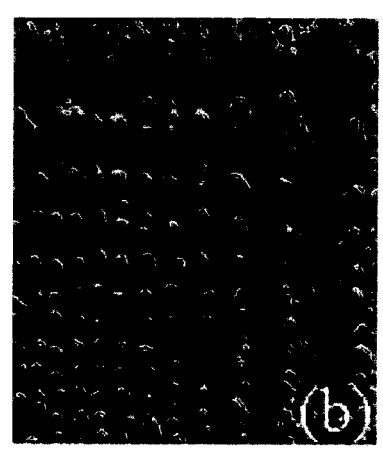

FIG. 19(a) illustrates an SEM image of a one-dimensional periodic structure made on a silicon substrate, according to exemplary embodiments of the present invention. FIG. 19(b) illustrates an SEM image of a two-dimensional periodic structure made on a silicon substrate, according to exemplary embodiments of the present invention. Periodic structures can be produced by controlling the laser intensity distribution on the surface of the sample. The laser intensity distribution can be controlled by using interference and diffraction. For example, interference fringes are created by placing a metal wire in a portion of the laser beam. The light diffracted by the wire interferes to produce an intensity distribution on the sample surface that results in a periodic structure of pillars. Alternatively, the incident laser beam is split into two components, and then recombined at various angles to control the periodicity. It is also possible to place several pinholes in the path of the laser beam to create a periodic circular pattern of pillars on the surface. By using laser beams with different wavelengths and controlling the interference patterns, the periodicity of the pillars can be adjusted from tens of nanometers to tens of micrometers.

In an exemplary embodiment of the present invention, copper or tungsten wires with diameters from 100 to 250 μm are used to create interference fringes. The sample is exposed to 1.4 mJ pulses of light with a wavelength of 800 nm, a pulse duration of 130 fs, and a repetition rate of 1 kHz. The laser scan speed is 0.1 in/sec, and scanning is performed after placing the sample inside a vacuum chamber filled with $SF_6$ at a pressure of 400 mbar. In order to create a two-dimensional array of pillars, the metal wires are crossed orthogonally and placed in the path of the laser beam. Also, the spacing between adjacent pillars can be controlled by changing the wavelength of the laser pulses. For example, when the laser wavelength is decreased, the spacing between adjacent pillars also decreases.

In another exemplary embodiment of the present invention, the laser texturing method was performed on various metallic surfaces. A metal is defined as an electrically conducting material. For example, titanium and stainless steel sheets are cut into small square-inch sized chips and cleaned with acetone and methanol. One such chip is put on a stage inside a vacuum chamber with a base pressure of around 1 mTorr, which is mounted on a high-precision computer-controlled X-Y stage. The chamber is rinsed and then backfilled with air at atmospheric pressure, $SF_6$ in a pressure range from 75 to 800 mbar, or helium in a pressure range from 75 to 800 mbar. The laser texturing method can also be conducted with a mixture of gases in different proportions and at different pressures, or in vacuum, with a chamber pressure of around 1 mbar. The samples are exposed to ultrafast laser pulses with a pulse energy of 0.95 mJ, a wavelength of 800 nm, a pulse width of 130 fs, and a repetition rate of 1 kHz from a regeneratively amplified Spectra-Physics Ti-sapphire laser system. Short laser pulse widths can also be used, including 1 fs to 1 μs pulses. Ultrafast laser pulses are a subcategory of short pulses, and can range from 1 femtosecond to hundreds of picoseconds. The laser beam is focused onto the sample surface by a coated lens with a focal length of 1 m, and the laser fluence is adjusted by using a Glan calcite polarizer.

The spatial profile of the laser pulse is Gaussian, and the fluence is calculated by using the laser spot size, which is determined by exposing a point on the sample surface to thousands of shots. In order to scan an area that is bigger than the laser spot size, the samples are translated using a motorized X-Y stage. Scanning also assists in making the surface structure more uniform by smoothing out any shot-to-shot irregularities in the beam profile. By varying the scanning speed of the X-Y stage, the number of laser pulses impinging on the sample surface at a particular spot is controlled. The spot size is about 0.3 mm.

Samples are produced with isolated single line scans, or with large areas created by overlapping several line scans. The step size between scan lines is chosen to be sufficiently small (less than 0.38 mm), so that successive lines overlap substantially. This further improves layer homogeneity. Homogeneity is further enhanced by performing two overlapping scans in orthogonal directions, rather than one overlapping scan with an exposure of the same total number of shots. After laser processing, the samples are analyzed with a scanning electron microscope (Zeiss SUPRA 40).

FIG. 20 shows SEM images of titanium surfaces treated with the laser texturing method for different background gas conditions. FIG. 20(a) shows an SEM image of a titanium surface treated in air, and FIG. 20(b) shows an SEM image of a titanium surface treated in vacuum. FIG. 20(c) shows an SEM image of a titanium surface treated in helium at a pressure less than 200 mbar, and FIG. 20(d) shows an SEM image of a titanium surface treated in $SF_6$ at a pressure greater than 400 mbar. As these figures show, pillar formation occurs in titanium that is treated with a laser fluence from 0.6 to 1.0 $J/cm^2$, and in vacuum or gas at low pressures less than 200 mbar. In order to create a well-developed pillar on titanium, it is necessary to irradiate the sample with around 1000 shots. However, increasing the number of shots or the laser fluence destroys the pillars.

FIG. 21 shows SEM images of stainless steel surfaces treated with the laser texturing method for different background gas conditions. FIG. 21(a) shows an SEM image of a stainless steel surface treated in air, and FIG. 21(b) shows an SEM image of a stainless steel surface treated in vacuum. FIG. 21(c) shows an SEM image of a stainless steel surface treated in helium at a pressure less than 200 mbar, and FIG. 21(d) shows an SEM image of a stainless steel surface treated in $SF_6$ at a pressure greater than 400 mbar. As shown in the figures, laser texturing forms pillars on stainless steel surfaces in air, vacuum, helium, and $SF_6$. However, in order to create a well-developed pillar on stainless steel, it is necessary to irradiate the sample with around 2000 shots. Both the stainless steel samples and the titanium samples turn pitch black after laser treatment. However, unlike titanium, pillar formation occurs on stainless steel in air.

FIG. 22 shows a series of SEM images viewed at 45° from the surface normal, which compares the results of the laser texturing method for various semiconductors and metals. In each case the surface of the material is treated with ultrafast laser pulses with a pulse width of 130 fs. FIG. 22(a) shows an SEM image of SiC treated with 260 shots at a laser fluence of around 1 $J/cm^2$ in 400 mbar of $SF_6$. FIG. 22(b) shows an SEM image of GaAs treated with 260 shots at a laser fluence of around 0.5 $J/cm^2$ in 400 mbar of $SF_6$. FIG. 22(c) shows an SEM image of titanium treated with 2000 shots at a laser fluence of around 0.3 $J/cm^2$ in 400 mbar of $SF_6$. FIG. 22(d) shows an SEM image of stainless steel treated with 2500 shots at a laser fluence of around 4.5 $J/cm^2$ in 400 mbar of $SF_6$. These figures show that the laser texturing method can form pillars on various semiconductors and metals.

In addition, the laser texturing method is likely to form pillars on ceramics, polymers, and alloys. By controlling the processing conditions of the laser texturing method for each material, the thermal, structural, optical, and electronic properties of the material can be tailored. Further, the formation of pillars can be controlled by changing the polarization state of the laser beam. A polarizer can change the output from the laser to be linearly, circularly, elliptically, or randomly polarized. The laser texturing method can be performed on surfaces of any geometrical shape, and is not limited to planar surfaces.

Similarly, the laser texturing method could also be used to process transparent materials, such as glass. The incident light could be absorbed by a two-photon process, or an appropriate wavelength could be selected for absorption by the transparent material. The altered surfaces formed by this method could be used in magnetic disk drives, because the disk drive and the head are spaced very closely together for data writing and reading.

The altered surfaces formed by the apparatuses and methods of the present invention can have great utility in photovoltaic technologies, as schematically illustrated in FIG. 26. The increased light trapping and the control of photogenerated charges can provide improved efficiency. In particular, the altered surfaces would be beneficial in photodetectors, because the surfaces allow for the development of more sensitive detectors with a high responsivity, and extend the spectral range into the infrared region of the spectrum. This could also enable the building of infrared sensors for various applications.

The altered surfaces would also be beneficial in heat dissipation, as schematically illustrated in FIG. 27. A large surface area is created by texturing, which allows gas molecules to exchange energy with the surface, and increases heat dissipation. Such a high-efficiency heat sink could be very important for microelectronics, power electronics, optoelectronics, and other devices that require efficient heat dissipation.

The altered surfaces can also be used in field emission, as schematically illustrated in FIG. 23. Due to the sharp geometry of pillars formed by the laser texturing process, very high electric fields can be generated at relatively low voltages. These high electric fields can be used for electron emission from surfaces, providing an efficient source of electrons for various electronic and optoelectronic device applications, such as field emission displays, sensors, and instruments.

The altered surfaces would also be beneficial in surface property control, as schematically illustrated in FIG. 25. Laser textured surfaces can be made hydrophobic or hydrophilic by controlling the texture and surface coating. This can affect the air or fluid flow across the surface of the material.

The altered surfaces would also be beneficial in micro fluidic applications. There is an increasing number of micro fluidic applications for chemical and biomedical applications of chips. As schematically illustrated in FIG. 25, textured surfaces in micro channels can provide a good method of controlling the fluid flow, which can impact DNA sequencing and other applications. The altered surfaces would also be beneficial in turbulence control for aerodynamic applications. The flow of gases can be controlled by inserting a textured surface into the flow path. Also, turbulence can be generated by using of textured surfaces. This effect can be used in aerospace applications.

The altered surfaces would also be beneficial in an optical beam block, as schematically illustrated in FIG. 24. The laser textured surface has an extremely low reflectance and transmittance in the visible to the far infrared region, allowing the surface to be an efficient beam block for various optical and manufacturing applications. The altered surfaces would also be beneficial in controlling the visual appearance of products, including the surface color. The laser texturing process provides a completely black surface, hence it can be used to control the color of the surface without using any paints, dyes, or pigments.

The altered surfaces would also be beneficial in catalytic activity, as schematically illustrated in FIG. 29. The large surface area created by texturing provides many sites for enhanced chemical activity, such as catalytic activity. These catalytic activities would be useful in fuel cell technology, chemical plants, and biomedical applications, including conversion of carbon monoxide to carbon dioxide. The large surface area can also be used for enhanced tissue growth and control. The altered surfaces would also be beneficial in bond strength improvement. The large surface area created by texturing allows more sites for bonding and interlocking, and improves the overall bond strength.

The altered surfaces would also be beneficial in thin film or fibrous whisker growth. Due to the formation of nanospikes or microspikes, it is possible to utilize a large number of tips for growth of other materials atop these tips, as schematically illustrated in FIG. 29. Also, because a small voltage can provide a high electric field, the growth can be controlled by the electric field.

The altered surfaces would also be beneficial in the production of nano or micro tips, as schematically illustrated in FIG. 29. Because the texturing process produces a large array of two-dimensional structures, micro or nano ordered tips can be fabricated. The nanospikes can be solid or hollow. These tips can be used in atomic force microscopy, optical data storage, and fluid control for automobiles and drug delivery.

The altered surfaces would also be beneficial in surface-enhanced Raman scattering. The Raman scattering method can be used to detect chemical or biochemical species. Usually Raman scattering signals are relatively low, but a Raman signal can be enhanced by many orders of magnitude by surface-enhanced Raman scattering. Laser textured surfaces coated with metals could provide an ideal template for surface-enhanced Raman scattering for sensor applications, such as single molecule detection. The altered surfaces would also be beneficial in biosensor applications. As schematically illustrated in FIG. 29, specific molecules can be attached atop the tips, and can be used for chemical or biochemical detection, by using methods such as fluorescence and phosphorescence.

The altered surfaces would also be beneficial in manufacturing optical elements. As schematically illustrated in FIGS. 24 and 28, various optical elements, such as diffraction gratings, low scattering surfaces, and antireflection surfaces can be prepared by texturing the optical element surface. Also, light absorption properties can be tailored by adjusting the laser parameters and thermal annealing conditions.

The altered surfaces would also be beneficial in photonic crystals. Photonic crystals are increasingly used for optoelectronic applications, such as wavelength selection and fabrication of negative refractive index materials. Periodic textured surfaces fabricated by laser texturing would be useful in these photonic crystals. The altered surfaces would also be beneficial in producing masters for replication. A textured surface can be used as template for transferring a pattern to a softer material by using mechanical pressure, with or without heat. This can provide a very low cost process for pattering surfaces such as compact discs. This process can also be used for transferring patterns to polymerics and biomaterials.

The altered surfaces would also be beneficial in fabricating mask-less periodic structures. By using an optical interference technique, periodic textured surfaces can be fabricated with a sub-micron period, without any mask fabrication. The altered surfaces would also be beneficial in pixelated devices. Some optoelectronic and microelectronic devices, such as CCD cameras, diode lasers, and light emitting diodes, require a two-dimensional geometry. Two-dimensional textured surfaces can be easily fabricated for optoelectronic and microelectronic applications. The altered surfaces would also be beneficial in producing substrates for single crystal film or nanoparticle growth.

The altered surfaces would also be beneficial in nano or micro pores. Textured surfaces can be further processed with chemical etching to provide a large number of nano or micro pores, which can be used for filtration or fluid flow control. Pores can be made by the laser texturing process if thin substrates are used, or if longer processing times are used. The altered surfaces would also be beneficial in controlling surface emissivity. By adjusting the surface texture, the surface emissivity and spectral properties can be controlled. This can provide camouflage objects, because such objects are harder to detect if they emit a low radiation signal.

The altered surfaces would also be beneficial in art and photography applications. As schematically illustrated in FIG. 28, laser texturing of surfaces can be used to write text and images on surfaces by controlling the light reflectivity of the surface. This technique can be used to produce name plates, part identification, hidden logos, trademarks, logos, and images. The texturing provides a black color, which produces a very high contrast between the written and unwritten areas. The process of the present invention can also be used to control the gray level in forming high definition images.

The altered surfaces would also be beneficial in radiation shielding. Laser textured surfaces provide a very good method for controlling radiation scattering, reflection, absorption, and transmission over a broad spectral range, including visible, infrared, microwave, terahertz, and radio waves.

The altered surfaces would also be beneficial in plasma applications. Sharp tips can provide a very high electric field, and hence can be used for localized or large area generation of plasma sources. These plasma sources can be used to purify water, kill germs, and destroy bio-chemical agents.

The altered surfaces would also be beneficial in protecting substrates from corrosion, and improving adhesion, such as epoxy adhesion to a metal surface. They can also be used to improve the adhesion of thin films to a surface, such as a TiN coating on drill bits, which would extend the lifetime of the drill bits.

The altered surfaces would also be beneficial in bone grafting applications. Body implants can become detached from the host tissue, due to inadequate biocompatibility and poor osteointegration. Using laser texturing to change the surface chemistry and physical texture of the implants can improve the biocompatibility and adhesion.

The altered surfaces would also be beneficial in controlling the tribological properties of materials, such as friction, wear resistance, load-bearing properties, and lubrication. The textured surface can act as a micro-hydrodynamic bearing, a micro-reservoir for a lubricant, or a trap for debris particles generated during a sliding or other motion. This could result in significant friction reduction in piston rings. Similarly, laser texturing of cylinder liners in the interior of an engine compartment could reduce wear, friction, oil consumption, and gas emissions.

Instead of performing the laser texturing method in chemical gases, the method could be performed in the presence of gaseous plasma. Because charged species in gaseous plasma can be very reactive, laser irradiation in the presence of gaseous plasma will provide a much faster speed for texture formation, and further enable control of surface properties. Plasma sources can be created by various methods, such as excitation with a radio frequency (RF) source, direct current (DC), alternating current (AC), or a laser system. This approach provides a method for multi-energy processing technology, where electrical energy for plasma or discharge creation, laser irradiation for melting and ablation, and chemical energy by the gaseous environment are utilized to enhance the process and the control of the surface properties. Also, the sample can be kept at elevated temperatures, or the sample surface can be irradiated by an infrared lamp to raise the surface temperature, in order to enhance the chemical reactions or reduce the laser energy. In addition, plasma or ion etching methods are commonly used for semiconductor chip fabrication and preparation of samples for transmission electron microscopy. The addition of ultrafast pulsed laser energy could be used to further enhance this process.

Combining the laser texturing method with various other processes would also be beneficial. For example, a one-step process for doping, texturing, and crystallization would be advantageous from a manufacturing standpoint. Also, laser texturing and laser surface cleaning could be combined to provide a one-step process. In addition, laser texturing and surface passivation could be performed as a one-step process. The chemical gas used in laser texturing could provide the surface passivation by sulfur or phosphorous diffusion. Finally, laser texturing could be performed in a one-step process with surface hardening. For example, the surface of steel can be textured, and if a reactive gas such as ammonia or nitrogen plasma is used, surface nitridation can be achieved. This provides improved surface properties, such as wear, wetting characteristics, and chemical interactions.

The foregoing description and drawings should be considered as only illustrative of the principles of the present invention. The present invention may be configured and performed in a variety of ways, and is not intended to be limited by the exemplary embodiments discussed herein. Numerous applications of the present invention will readily occur to those skilled in the art who consider the foregoing description. Therefore, the present invention is not to be limited to the specific examples disclosed, or the construction and operation shown and described. Rather, all suitable modifications and equivalents are within the scope of the present invention, as defined in the appended claims.

What is claimed is:

1. A method for micro texturing a surface of a material, comprising:

providing a gaseous or vacuum environment in an area around the surface of the material;

irradiating a portion of the surface with short laser pulses;

moving at least one of the surface or a laser beam relative to each other to allow the short laser pulses to irradiate the surface;

wherein the method produces a periodic array of micro pillars, semi-periodic array of micro pillars, or a non-periodic array of micro pillars on the surface, resulting in changes in properties of the surface wherein nanospikes are produced atop the micro pillars;

wherein said material comprises a semiconductor;

wherein the laser pulses have a duration of between about one femtosecond and about 999 picoseconds; and wherein the laser pulses have a wavelength of between about 400 and about 1,600 nm.

2. The method of claim 1, wherein said surface remains stationary and said laser beam moves.

3. The method of claim 1, wherein said laser beam remains stationary and said surface moves.

4. The method of claim 1, wherein moving comprises translating in the x-y direction or translating or rotating in the z-direction or both translating in the x-y direction and translating or rotating or moving in the z direction.

5. The method of claim 1 wherein, said laser beam moves relative to said surface by using a mirror, galvo-head, an optical element, or any combination thereof to change the path of said laser beam.

6. The method of claim 1, wherein said gaseous environment comprises air at atmospheric pressure, below atmospheric pressure, or above atmospheric pressure.

7. The method of claim 1, further comprising sharpening the nanospikes by at least one of chemical etching and ion etching after irradiating the surface.

8. The method of claim 1, wherein the laser pulses have a laser pulse energy density of between about 0.1 J/cm$^2$ and about 4.5 J/cm$^2$.

9. The method of claim 1, wherein the laser pulses have a wavelength of between 400 and 800 nm.

10. The method of claim 1, wherein irradiating the surface further comprises scanning the surface in a plurality of directions.

11. The method of claim 1, wherein irradiating the surface further comprises scanning the surface in a single direction a plurality of times.

12. The method of claim 1, further comprising controlling a surface texture by controlling a polarization state of the laser pulses.

13. The method of claim 1, further comprising controlling an electrical conductivity of the material by controlling texturing parameters.

14. The method of claim 1, wherein irradiating the surface comprises at least partially crystallizing the irradiated surface.

15. The method of claim 1, further comprising controlling a spacing between adjacent pillars by controlling a wavelength of the laser pulses, a laser pulse energy density, and a number of laser pulses.

16. The method of claim 15, wherein said controlling further comprises controlling the spacing between adjacent pillars and/or their orientation by controlling an angle of incidence of said laser pulses or inclining the sample or combination thereof.

17. The method of claim 1, wherein gaseous environment comprises at least one of air, sulfur hexafluoride gas, hydrogen chloride gas, helium gas, argon gas, other fluoride based gasses, or other chloride based gases, or other chemical gases.

18. The method of claim 1, wherein said gaseous environment has a pressure of no more than 0.1 atmospheres.

19. The method of claim 1, wherein said gaseous environment comprises a gaseous plasma.

20. The method of claim 1, further comprising controlling of pillars by controlling said gaseous or vacuum environment.

21. The method of claim 1, further comprising controlling the formation of said pillars by post irradiation processing.

22. A method of using the textured surface of claim 1 to manufacture an optical beam block which absorbs substantially all light from the visible to the far-infrared.

23. The method of claim 1, wherein the changed properties are at least one of optical properties, thermal properties, and electrical properties.

24. A method for micro texturing a semiconductor surface, comprising:
    irradiating a portion of the semiconductor surface with short laser pulses;
    moving at least one of the surface and a laser beam relative to each other to allow the short laser pulses to irradiate another portion of the surface;
    wherein the method produces micro pillars on the surface, resulting in changes in properties of the surface; wherein nanospikes are produced atop the micro pillars;
    wherein the laser pulses have a duration of between about one femtosecond and about 999 picoseconds; and
    wherein the laser pulses have a wavelength of between about 400 and about 1,600 nm.

25. The method of claim 24, wherein the pillars are produced in a periodic or non-periodic array.

26. The method of claim 24, wherein said surface remains stationary and said laser beam moves.

27. The method of claim 24, wherein said laser beam remains stationary and said surface moves.

28. The method of claim 24, wherein moving comprises translating in the x-y direction or translating or rotating in the z-direction or both translating in the x-y direction and translating or rotating or moving in the z direction.

29. The method of claim 24, wherein said laser beam moves relative to said surface by using a mirror, galvo-head, an optical element, or any combination thereof to change the path of said laser.

30. The method of claim 24, further comprising providing an environment of gas in an area around the surface.

31. The method of claim 30, wherein the environment of gas comprises at least one of air, sulfur hexafluoride gas, hydrogen chloride gas, helium gas, argon gas, other fluoride based gasses, or other chloride based gasses, or other chemical gasses.

32. The method of claim 30, wherein the environment of gas has a pressure of no more than 0.1 atmospheres.

33. The method of claim 30, wherein the environmet of gas comprises a gaseous plasma.

34. The method of claim 24, wherein the surface is in air at atmospheric pressure.

35. The method of claim 24, wherein the laser pulses have a laser pulse energy density of between about 0.1 J/cm$^2$ and about 4.5 J/cm$^2$.

36. The method of claim 24, wherein the laser pulses have a wavelength of between 400 and 800 nm.

37. The method of claim 24, wherein irradiating the surface further comprises scanning the surface in a plurality of directions.

38. The method of claim 24, further comprising controlling a surface texture by controlling a polarization state of the laser pulses.

39. The method of claim 24, further comprising controlling an electrical conductivity of the material by controlling texturing parameters.

40. The method of claim 24, further comprising controlling a periodicity of pillars by controlling said gaseous or vacuum environment.

41. The method of claim 24, further comprising controlling a periodicity of pillars by controlling process parameters.

42. The method of claim 24, further comprising controlling the formation of said pillars by post irradiation processing.

43. A method of using the textured surface of claim 1 or 24 to provide a photovoltaic device.

44. A method of using the textured surface of claim 1 or 24 to provide a photodetector.

45. A method of using the textured surface of claim 1 or 24 to provide a high-efficiency heat sink for an electronic device.

46. A method of using the textured surface of claim 1 or 24 to provide a very high electric field for electron emission.

47. A method of using the textured surface of claim 1 or 24 to generate catalytic activity.

48. A method of using the textured surface of claim 1 or 24 to perform osteointegration/osseointegration of a body implant.

49. A method of using the textured surface of claim 1 or 24 to control the flow of air or fluid over the surface.

50. A method of using the textured surface of claim 1 or 24 to create a two-dimensional array of micro or nano dimensioned ordered tips.

51. A method of using the textured surface of claim 1 or 24 in micro fluidic applications.

52. The method of claim 1 or 24, further comprising controlling a color of the surface.

53. A method of using the textured surface of claim 1 or 24 to produce a master for replication.

54. A method of using the textured surface of claim 24 to manufacture an optical beam block which absorbs substantially all light from the visible to the far-infrared.

55. The method of using the textured surface of claim 1 or 24 to provide an element to control light reflection or transmission in an optical device.

56. The method of using the textured surface of claim 1 or 24 to provide an electrical device.

57. The method of claim 1 or 24, further comprising processing the surface with chemical etching to provide nano or micro pores on the surface.

58. The method of claim 1 or 24, further comprising controlling an emissivity of the surface.

59. The method of claim 1 or 24, further comprising writing text or images on the surface by controlling a light reflectivity.

60. A method of using the textured surface of claim 1 or 24 to provide a radiation shield which operates in a broad spectral range.

61. A method of using the textured surface of claim 1 or 24 to provide an infrared sensor.

62. A method of using the textured surface of claim 1 or 24 to prevent corrosion and provide adhesion.

63. The method of claim 24, wherein the changed properties are at least one of optical properties, thermal properties, and electrical properties.

64. The method claim 24, wherein the surface is in a vacuum environment.

65. A system for micro texturing a surface of a material comprising:
a chamber in an area around the surface of the material to provide a gaseous or vacuum environment;
an energy source providing a power supply for a radiation source, said radiation source for irradiating at least a portion of the surface;
a base for retaining said surface, said base or radiation source adapted to move relative to one another for irradiation wherein a periodic array of micro pillars or a non-periodic array of micro pillars on the surface, resulting in changes in properties of the surface; wherein nanospikes are produced atop the micro pillars;
wherein said material comprises semiconductor;
wherein said irradiation has a duration of between about one femtosecond and about 999 picoseconds; and
wherein said laser pulses have a wavelength of between about 400 nanometers and about 1,600 nanometers.

66. The system of claim 65, wherein said both a periodic array of pillars and a non-periodic array of pillars on the surface are produced, resulting in changes in properties of the surface.

67. The system of claim 65, wherein said radiation source comprises a laser.

68. The system of claim 65, wherein said chamber provides a means for controlling the environment therein.

69. The system of claim 65, wherein said base is movable in the x-y direction or rotatable or movable in the z direction or both movable in the x-y direction and movable or rotatable in the z direction.

70. A system for micro texturing a surface of a material comprising:
a chamber in an area around the surface of the material to provide a gaseous or vacuum environment;
an energy source providing a power supply for a radiation source, said radiation source for irradiating at least a portion of the surface, wherein said surface is provided in a gaseous or vacuum environment;
wherein said material comprises a semiconductor;
a base for retaining said surface, said base or radiation source adapted to move relative to one another for irradiation wherein micro pillars are produced on said portion of the surface, resulting in changes in properties of the surface; wherein nanospikes are produced atop the micro pillars;
wherein said irradiation has a duration of between about one femtosecond and 999 picoseconds; and
wherein said laser pulses have a wavelength of between about 400 and about 1,600 nanometers.

71. A method for micro texturing a surface of a material, comprising:
providing a gaseous or vacuum environment in an area around the surface of the material;
irradiating a portion of the surface with energy pulses;
moving at least one of the surface or an energy beam relative to each other to allow the energy pulses to irradiate the surface;
wherein the method produces a periodic array of micro pillars or a non-periodic array of micro pillars on the surface, resulting in changes in properties of the surface; wherein nanospikes are produced atop the micro pillars;
wherein said material comprises semiconductor;
wherein said irradiation has a duration of between about one femtosecond and about 999 picoseconds; and
wherein said energy pulses have a wavelength of between about 400 and about 1,600 nanometers.

* * * * *